United States Patent
Ebbels et al.

(10) Patent No.: US 6,683,455 B2
(45) Date of Patent: Jan. 27, 2004

(54) METHODS FOR SPECTRAL ANALYSIS AND THEIR APPLICATIONS: SPECTRAL REPLACEMENT

(75) Inventors: Timothy Mark David Ebbels, London (GB); Elaine Holmes, London (GB); John Christopher Lindon, London (GB); Jeremy Kirk Nicholson, London (GB)

(73) Assignee: Metabometrix Limited, London (GB)

( * ) Notice: Subject to any disclaimer, the term of this patent is extended or adjusted under 35 U.S.C. 154(b) by 19 days.

(21) Appl. No.: 10/029,380

(22) Filed: Dec. 20, 2001

(65) Prior Publication Data

US 2002/0145425 A1 Oct. 10, 2002

(30) Foreign Application Priority Data

Dec. 22, 2000 (GB) .............................................. 0031566

(51) Int. Cl.⁷ ................................................. G01N 3/00
(52) U.S. Cl. ..................................................... 324/309
(58) Field of Search ................................... 324/307, 309

(56) References Cited

U.S. PATENT DOCUMENTS

| | | | | | |
|---|---|---|---|---|---|
| 4,945,234 A | * | 7/1990 | Goodman et al. | ........... | 250/291 |
| 5,343,389 A | * | 8/1994 | Otvos | ........... | 436/173 |
| 5,579,462 A | * | 11/1996 | Barber et al. | ........... | 345/440 |
| 5,633,997 A | * | 5/1997 | Barber et al. | ........... | 345/440 |
| 5,760,785 A | * | 6/1998 | Barber et al. | ........... | 345/440 |
| 5,939,447 A | * | 8/1999 | Gorycki et al. | ........... | 514/382 |
| 5,989,827 A | * | 11/1999 | Fesik et al. | ........... | 435/7.1 |
| 6,043,024 A | * | 3/2000 | Fesik et al. | ........... | 435/4 |
| 6,167,297 A | * | 12/2000 | Benaron | ........... | 600/431 |
| 6,240,372 B1 | * | 5/2001 | Gross et al. | ........... | 702/71 |
| 6,246,901 B1 | * | 6/2001 | Benaron | ........... | 600/431 |
| 6,285,901 B1 | * | 9/2001 | Taicher et al. | ........... | 600/410 |

OTHER PUBLICATIONS

Anker, L.S., and Jurs, P.C., 1992, "Prediction of C–13 nuclear magnetic resonance chemical shifts by artificial neural networks," *Anal. Chem.*, vol. 64, pp. 1157–1164.

Anthony, M.L. et al., 1994, "Pattern recognition classification of the site of nephrotoxicity based on metabolic data derived from proton nuclear magnetic resonance spectra of urine," *Mol. Pharmacol.*, vol. 46, pp. 199–211.

Anthony, M.L. et al., 1995, "Classification of toxin–induced changes in $^1$H NMR spectra of urine using an artificial neural network," *J. Pharm. Biomed. Anal.*, vol. 13, pp. 205–211.

(List continued on next page.)

*Primary Examiner*—Diego Gutierrez
*Assistant Examiner*—Dixomara Vargas
(74) *Attorney, Agent, or Firm*—Morrison & Foerster LLP

(57) ABSTRACT

This invention pertains to methods for the analysis of biological data, particularly spectra, for example, nuclear magnetic resonance (NMR) and other types of spectra. More specifically, the present invention pertains to a method for processing a sample spectrum comprising: replacing each of one or more target regions in said sample spectrum with a corresponding replacement region of a master control spectrum to give a target-replaced sample spectrum, wherein said replacement region has been scaled so as to have the same fraction of the total integrated intensity in said target-replaced sample spectrum as it did in said master control spectrum. The present invention also pertains to analysis methods which employ the methods of the present invention, such as methods of identifying a biomarker or biomarker combination for an applied stimulus; classification of an applied stimulus; diagnosis of an applied stimulus; therapeutic monitoring of a subject undergoing therapy; evaluating drug therapy and/or drug efficacy; detecting toxic side-effects of drug; characterizing and/or identifying a drug in overdose.

35 Claims, 10 Drawing Sheets

OTHER PUBLICATIONS

Beckwith–Hall, B.M. et al., 1998, "Nuclear magnetic spectroscopic and principal components analysis investigations into biochemical effects of three model hepatotoxins," *Chem. Res. Tox.*, vol. 11, pp. 260–272.

Bretthorst, 1990, "An Introduction to Parameter Estimation Using Bayesian Probability Theory," in: *Maximum Entropy and Bayesian Methods*, (Fougere, P.F., editor) (Kluwer Academic Publishers, The Netherlands), pp. 53–79.

Bro, R., 1997, "PARAFAC. Tutorial and applications," in *Chemometrics and Intelligent Laboratory Systems*, vol. 38, pp. 149–171.

Broomhead, D.S., and Lowe, D., 1988, "Multivariable functional interpolation and adaptive networks," *Complex Systems*, vol. 2, pp. 321–355.

Brown, T.R. and Stoyanova, R., 1996, "NMR spectral quantitation by principal–component analysis. II. Determination of frequency and phase shifts," *J. Magn. Reson.*, vol. 112B, pp. 32–43.

Fan, T.W.–M., 1996, "Metabolite profiling by one– and two–dimensional NMR analysis of complex mixtures," *Prog. NMR Spectrosc.*, vol. 28, pp. 161–219.

Farrant, R.D., et al., 1992, "An automatic data reduction and transfer method to aid pattern recognition analysis and classification of NMR spectra," *J. Pharm. Biomed. Anal.*, vol. 10, pp. 141–144.

Frank, I.E., et al., 1984, "Prediction of product quality from spectral data using the partial least–squares method," *J. Chem. Info. Comp.*, vol. 24, pp. 20–24.

Gartland, K.P.R. et al., 1990a, "A pattern recognition approach to the comparison of PMR and clinical chemical data for classification of nephrotoxicity," *J. Pharm. Biomed. Anal.*, vol. 8, pp. 963–968.

Gartland, K.P.R. et al., 1990b, "Pattern recognition analysis of high resolution $^1$H NMR spectra of urine. A nonlinear mapping approach to the classification of toxicological data," *NMR in Biomed.*, vol. 3, pp. 166–172.

Gartland, K.P.R. et al., 1991, "Application of pattern recognition methods to the analysis and classification of toxicological data derived from proton nuclear magnetic resonance spectroscopy of urine," *Mol. Pharmacol.*, vol. 39, pp. 629–642.

Geisow, M.J., 1998, "Proteomics: One small step for a digital computer, one giant leap for humankind," *Nature Biotechnology*, vol. 16, p. 206.

Gygi, S.P., et al., 1999, "Correlation between protein and mRNA abundance in yeast," *Molecular and Cellular Biology*, vol. 19, pp. 1720–1730.

Hare, B.J., and Prestegard, J.H., 1994, "Application of neural networks to automated assignment of NMR specta of proteins," *J. Biomol. NMR*, vol. 4, pp. 35–46.

Holmes, E. et al., 1998a, "Development of a model for classification of toxin–induced lesions using $^1$H NMR spectroscopy of urine combined with pattern recognition," *NMR in Biomed.*, vol. 11, pp. 235–244.

Holmes, E. et al., 1998b, "The identification of novel biomarkers of renal toxicity using automatic data reduction techniques and PCA of proton NMR spectra of urine," *Chemomet. & Intel. Lab Systems*, vol. 44, pp. 245–255.

Holmes, E., et al., 1992, "Nuclear magnetic resonance spectroscopy and pattern recognition analysis of the biochemical processes associated with the progression and recovery from nephrotoxic lesions in the rat induced by mercury(II)chloride and 2–bromoethanamine," *Mol. Pharmacol.*, vol. 42, pp. 922–930.

Holmes, E., et al., 1994, "Automatic data reduction and pattern recognition methods for analysis of $^1$H nuclear magnetic resonance spectra of human urine from normal and pathological states," *Anal. Biochem.*, vol. 220, pp. 284–296.

Klenk, H.–P., et al., 1997, "The complete genome sequence of the hyperthermophilic, sulphate–reducing archaeon *Archaeoglobus fulgidus*," *Nature*, vol. 390, pp. 364–370.

Lindon, J.C., et al., 1999, "NMR spectroscopy of biofluids," in *Annual Reports on NMR Spectroscopy* (Webb, G.A., ed.), Academic Press (London), vol. 38, pp. 1–88.

Lindon, J.C., Ferrige A.G., 1980, "Digitisation and Data Processing in Fourier Transform NMR," *Progress in NMR Spectroscopy*, vol. 14, pp. 27–66.

Moka, D., et al., 1998, "Biochemical classification of kidney carcinoma biopsy samples using magic–angle–spinning $^1$H NMR spectroscopy," *J. Pharm. Biomed. Anal.*, vol. 17, pp. 125–132.

Nicholson, J.K. et al., 1995, "750 MHz $^1$H and $^1$H—$^{13}$C NMR spectroscopy of human blood plasma," *Anal. Chem.*, vol. 67, pp. 793–811.

Nicholson, J.K. et al., 1999, "Metabonomics: understanding the metabolic responses of living systems to pathophysiological stimuli via multivariate statistical analysis of biological NMR spectroscopic data," *Xenobiotica*, vol. 29, pp. 1181–1189.

Nicholson, J.K., Wilson, I.D. 1989, "High resolution proton magnetic resonance spectroscopy of biological fluids," *Prog. NMR Spectrosc.*, vol. 21, pp. 449–501.

Quinlan, J.R., 1986, "Induction of decision trees," *Machine Learning*, vol. 1, pp. 81–106.

Specht, D.F., 1990, "Probabilistic neural networks," *Neur. Networks*, vol. 3, pp. 109–118.

Spraul, M. et al., 1994, "Automatic reduction of NMR spectroscopic data for statistical and pattern recognition classification of samples," *J. Pharm. Biomed. Anal.*, vol. 12, pp. 1215–1225.

Sze, D.Y. and Jardetzky O., 1994, "High–resolution proton NMR studies of lymphocyte extracts," *Immunomethods*, vol. 4, pp. 113–126.

Tate, A.R., et al., 2000, "Distinction between normal and renal cell carcinoma kidney cortical biopsy samples using pattern recognition of $^1$H magic angle spinning (MAS) NMR specta," *NMR in Biomedicine*, vol. 13, pp. 64–71.

Tomlins, A.M. et al., 1998, "High resolution magic angle spinning $^1$H nuclear magnetic resonance analysis of intact prostatic hyperplastic and tumour tissues," *Anal. Comm.*, vol. 35, pp. 113–115.

Tranter, G.E., et al., 1999, "Metabonomic prediction of drug toxicity via probabilistic neural networks analysis of NMR biofluid data," *Abstr. 9$^{th}$ North American ISSX Meeting*, Oct. 24–28, 1999, p. 246.

Wold, H., 1966, "Estimation of principal components and related models by iterative least squares" in *Multivariate Analysis* (P.R. Krishnaiah, Ed.) Academic Press, New York, USA, pp 391–420.

Wold, S., 1976, "Pattern recognition by means of disjoint principal components models," *Pattern Recog.*, vol. 8, pp. 127–139.

\* cited by examiner

METHODS FOR SPECTRAL ANALYSIS AND THEIR APPLICATIONS: SPECTRAL REPLACEMENT

TECHNICAL FIELD

This invention pertains generally to the field of chemometrics, metabonomics, and, more particularly, to methods for the analysis of chemical, biochemical, and biological data, for example, spectra, for example, nuclear magnetic resonance (NMR) and other types of spectra.

BACKGROUND

Significant progress has been made in developing methods to determine and quantify the biochemical processes occurring in living systems. Such methods are valuable in the diagnosis, prognosis and treatment of disease, the development of drugs, as well as for improving therapeutic regimes for current drugs.

Diseases of the human or animal body (such as cancers, degenerative diseases, autoimmune diseases and the like) have an underlying basis in alterations in the expression of certain genes. The expressed gene products, proteins, mediate effects such as abnormal cell growth, cell death or inflammation. Some of these effects are caused directly by protein—protein interactions; other are caused by proteins acting on small molecules (e.g. "second messengers") which trigger effects including further gene expression.

Likewise, disease states caused by external agents such as viruses and bacteria provoke a multitude of complex responses in infected host.

In a similar manner, the treatment of disease through the administration of drugs can result in a wide range of desired effects and unwanted side effects in a patient.

At the genetic level, methods for examining gene expression in response to these types of events are often referred to as "genomic methods," and are concerned with the detection and quantification of the expression of an organism's genes, collectively referred to as its "genome," usually by detecting and/or quantifying genetic molecules, such as DNA and RNA. Genomic studies often exploit a new generation of proprietary "gene chips," which are small disposable devices encoded with an array of genes that respond to extracted mRNAs produced by cells (see, for example, Klenk et al., 1997). Many genes can be placed on a chip array and patterns of gene expression, or changes therein, can be monitored rapidly, although at some considerable cost.

However, the biological consequences of gene expression, or altered gene expression following perturbation, are extremely complex. This has led to the development of "proteomic methods" which are concerned with the semi-quantitative measurement of the production of cellular proteins of an organism, collectively referred to as its "proteome" (see, for example, Geisow, 1998). Proteomic measurements utilise a variety of technologies, but all involve a protein separation method, e.g., 2D gel-electrophoresis, allied to a chemical characterisation method, usually, some form of mass spectrometry.

In recent years, it has been appreciated that the reaction of human and animal subjects to disease and treatments for them can vary according to the genomic makeup of an individual. This has led to the development of the field of "pharmacogenomics." A fuller understanding of how an individual's own genome reacts to a particular disease will allow the development of new therapies, as well as the refinement of existing ones.

At present, genomic and proteomic methods, which are both expensive and labour intensive, have the potential to be powerful tools for studying biological response. The choice of method is still uncertain since careful studies have sometimes shown a low correlation between the pattern of gene expression and the pattern of protein expression, probably due to sampling for the two technologies at inappropriate time points (see, e.g., Gygi et al., 1999). Even in combination, genomic and proteomic methods still do not provide the range of information needed for understanding integrated cellular function in a living system, since they do not take account of the dynamic metabolic status of the whole organism.

For example, genomic and proteomic studies may implicate a particular gene or protein in a disease or a xenobiotic response because the level of expression is altered, but the change in gene or protein level may be transitory or may be counteracted downstream and as a result there may be no effect at the cellular and/or biochemical level. Conversely, sampling tissue for genomic and proteomic studies at inappropriate time points may result in a relevant gene or protein being overlooked, Nonetheless, recent advances in genomics and proteomics now permit the rapid identification of new potential targets for drug development. With a new target in hand, and with the aid of combinatorial chemistry and high throughput screening, the pharmaceutical industry is capable of rapidly generating and screening thousands of new candidate compounds each week.

However, in practice, only a few of these candidate compounds will be taken further, for example, into pre-clinical and clinical development. It is therefore critical to identify those candidate compounds with the most promise, and this is usually judged by efficacy and toxicology, before selection for clinical studies. However, these selection processes are imperfect and many drugs fail in clinical trials due to lack of efficacy and/or toxicological effects. It is also possible that other drugs may fait overall because they are only effective in a subgroup of patients who have an unrecognised pharmacogenomic response. There is a great need to find new ways of reducing this compound "attrition" or losses of drugs late in the development process, for example, through the development and application of analytical technologies designed to maximise efficiency of compound selection and to minimise attrition rates.

While genomic and proteomic methods may be useful aids in compound selection, they do suffer from substantial limitations. For example, while genomic and proteomic methods may ultimately give profound insights, into toxicological mechanisms and provide new surrogate biomarkers of disease, at present it is very difficult to relate genomic and proteomic findings to classical cellular or biochemical indices or endpoints. One simple reason for this is that with current technology and approach, the correlation of the time-response to drug exposure is difficult. Further difficulties arise with in vitro cell-based studies. These difficulties are particularly important for the many known cases where the metabolism of the compound is a prerequisite for a toxic effect and especially true where the target organ is not the site of primary metabolism. This is particularly true for pro-drugs, where some aspect of in situ chemical (e.g., enzymatic) modification is required for activity.

A new "metabonomic" approach has been proposed which is aimed at augmenting and complementing the information provided by genomics and proteomics. "Metabonomics" is conventionally defined as "the quantitative measurement of the multiparametric metabolic response of living systems to pathophysiological stimuli or genetic modification" (see, for example, Nicholson et al., 1999). This concept has arisen primarily from the application of $^1$H NMR spectroscopy to study the metabolic composition of biofluids, cells, and tissues and from studies utilising pattern recognition (PR), expert systems and other chemoinformatic tools to interpret and classify complex NMR-generated metabolic data sets. Metabonomic methods have the potential, ultimately, to determine the entire dynamic metabolic make-up of an organism.

A pathological condition or a xenobiotic may act at the pharmacological level only and hence may not affect gene regulation or expression directly. Alternatively significant disease or toxicological effects may be completely unrelated to gene switching. For example, exposure to ethanol in vivo may switch on many genes but none of these gene expression events explains drunkenness. In cases such as these, genomic and proteomic methods are likely to be ineffective. However, all disease or drug-induced pathophysiological perturbations result in disturbances in the ratios and concentrations, binding or fluxes of endogenous biochemicals, either by direct chemical reaction or by binding to key enzymes or nucleic acids that control metabolism. If these disturbances are of sufficient magnitude, effects will result which will affect the efficient functioning of the whole organism. In body fluids, metabolites are in dynamic equilibrium with those inside cells and tissues and, consequently, abnormal cellular processes in tissues of the whole organism following a toxic insult or as a consequence of disease will be reflected in altered biofluid compositions.

Fluids secreted, excreted, or otherwise derived from an organism ("biofluids") provide a unique window into its biochemical status since the composition of a given biofluid is a consequence of the function of the cells that are intimately concerned with the fluid's manufacture and secretion. For example, the composition of a particular fluid can carry biochemical information on details of organ function (or dysfunction), for example, as a result of xenobiotics, disease, and/or genetic modification. Similarly, the composition and condition of an organism's tissues are also indicators of the organism's biochemical status. Examples of biofluids include, for example, urine, blood plasma, milk, etc.

Biofluids often exhibit very subtle changes in metabolite profile in response to external stimuli. This is because the body's cellular systems attempt to maintain homeostasis (constancy of internal environment), for example, in the face of cytotoxic challenge. One means of achieving this is to modulate the composition of biofluids. Hence, even when cellular homeostasis is maintained, subtle responses to disease or toxicity are expressed in altered biofluid composition. However, dietary diurnal and hormonal variations may also influence biofluid compositions, and it is clearly important to differentiate these effects if correct biochemical inferences are to be drawn from their analysis.

One of the most successful approaches to biofluid analysis has been the use of NMR spectroscopy (see, for example, Nicholson et al., 1989); similarly, intact tissues have been successfully analysed using magic-angle-spinning $^1$H NMR spectroscopy (see, for example, Moka et al., 1998; Tomlins et al., 1998).

The NMR spectrum of a biofluid provides a metabolic fingerprint or profile of the organism from which the biofluid was obtained, and this metabolic fingerprint or profile is characteristically changed by a disease, toxic process, or genetic modification. For example, NMR spectra may be collected for various states of an organism, e.g., pre-dose and various times post-dose, for one or more xenobiotics, separately or in combination; healthy (control) and diseased animal; unmodified (control) and genetically modified animal.

For example, in the evaluation of undesired toxic side-effects of drugs, each compound or class of compound produces characteristic changes in the concentrations and patterns of endogenous metabolites in biofluids that provide information on the sites and basic mechanisms of the toxic process. $^1$H NMR analysis of biofluids has successfully uncovered novel metabolic markers of organ-specific toxicity in the laboratory rat, and it is in this "exploratory" role that NMR as an analytical biochemistry technique excels. However, the biomarker information in NMR spectra of biofluids is very subtle, as hundreds of compounds representing many pathways can often be measured simultaneously, and it is this overall metabonomic response to toxic insult that so well characterises the lesion.

All biological fluids and tissues have their own characteristic physico-chemical properties, and these affect the types of NMR experiment that may be usefully employed. One major advantage of using NMR spectroscopy to study complex biomixtures is that measurements can often be made with minimal sample preparation (usually with only the addition of 5–10% $D_2O$) and a detailed analytical profile can be obtained on the whole biological sample. Sample volumes are small, typically 0.3 to 0.5 mL for standard probes, and as low as 3 $\mu$L for microprobes. Acquisition of simple NMR spectra is rapid and efficient using flow-injection technology. It is usually necessary to suppress the water NMR resonance.

Many biofluids are not chemically stable and for this reason care should be taken in their collection and storage. For example, cell lysis in erythrocytes can easily occur. If a substantial amount of $D_2O$ has been added, then it is possible that certain $^1$H NMR resonances will be lost by H/D exchange. Freeze-drying of biofluid samples also causes the loss of volatile components such as acetone. Biofluids are also very prone to microbiological contamination, especially fluids, such as urine, which are difficult to collect under sterile conditions. Many biofluids contain significant amounts of active enzymes, either normally or due to a disease state or organ damage, and these may enzymes may alter the composition of the biofluid following sampling. Samples should be stored deep frozen to minimise the effects of such contamination. Sodium azide is usually added to urine at the collection point to act as an antimicrobial agent. Metal ions and or chelating agents (e.g., EDTA) may be added to bind to endogenous metal ions (e.g., $Ca^{2+}$, $Mg^{2+}$ and $Zn^{2+}$) and chelating agents (e.g., free amino acids, especially glutamate, cysteine, histidine and aspartate; citrate) to alter and/or enhance the NMR spectrum.

In all bases the analytical problem usually involves the detection of "trace" amounts of analytes in a very complex matrix of potential interferences. It is, therefore, critical to choose a suitable analytical technique for the particular class of analyte of interest in the particular biomatrix which could be a biofluid or a tissue. High resolution NMR spectroscopy (in particular $^1$H NMR) appears to be particularly appropriate. The main advantages of using $^1$H NMR spectroscopy in this area are the speed of the method (with spectra being obtained in 5 to 10 minutes), the requirement for minimal sample preparation, and the fact that it provides a nonselective detector for all the abnormal metabolites in the biofluid regardless of their structural type, providing only that they are present above the detection limit of the NMR experiment and that they contain non-exchangeable hydrogen atoms. The speed advantage is of crucial importance in this area of work as the clinical condition of a patient may require rapid diagnosis, and can change very rapidly and so correspondingly rapid changes must be made to the therapy provided.

NMR studies of body fluids should ideally be performed at the highest magnetic field available to obtain maximal dispersion and sensitivity and most $^1H$ NMR studies have been performed at 400 MHz or greater. With every new increase in available spectrometer frequency the number of resonances that can be resolved in a biofluid increases and although this has the effect of solving some assignment problems, it also poses new ones. Furthermore, there are still important problems of spectral interpretation that arise due to compartmentation and binding of small molecules in the organised macromolecular domains that exist in some biofluids such as blood plasma and bile. All this complexity need not reduce the diagnostic capabilities and potential of the technique, but demonstrates the problems of biological variation and the influence of variation on diagnostic certainty.

The information content of biofluid spectra is very high and the complete assignment of the $^1H$ NMR spectrum of most biofluids is usually not possible (even using 900 MHz NMR spectroscopy, the highest frequency commercially available). However, the assignment problems vary considerably between biofluid types. Some fluids have near constant composition and concentrations and in these the majority of the NMR signals have been assigned. In contrast, urine composition can be very variable and there is enormous variation in the concentration range of NMR-detectable metabolites; consequently, complete analysis is much more difficult. Those metabolites present close to the limits of detection for 1-dimensional (1D) NMR spectroscopy (ca. 100 nM for many metabolites at 800 MHz) pose severe NMR spectral assignment problems. (In absolute terms, the detection limit may be ca. 4 nmol, e.g., 1 $\mu$g of a 250 g/mol compound in a 0.5 mL sample volume.) Even at the present level of technology in NMR, it is not yet possible to detect many important biochemical substances, e.g. hormones, proteins or nucleic acids in body fluids because of problems with sensitivity, line widths, dispersion and dynamic range and this area of research will continue to be technology-limited. In addition, the collection of NMR spectra of biofluids may be complicated by the relative water intensity, sample viscosity, protein content, lipid content, low molecular weight peak overlap.

Usually in order to assign $^1H$ NMR spectra, comparison is made with spectra of authentic materials and/or by standard addition of an authentic reference standard to the sample. Additional confirmation of assignments is usually sought from the application of other NMR methods, including, for example, 2-dimensional (2D) NMR methods, particularly COSY (correlation spectroscopy), TOCSY (total correlation spectroscopy), inverse-detected heteronuclear correlation methods such as HMBC (heteronuclear multiple bond correlation), HSQC (heteronuclear single quantum coherence), and HMQC (heteronuclear multiple quantum coherence), 2D J-resolved (JRES) methods, spin-echo methods, relaxation editing, diffusion editing (including both 1D NMR and 2D NMR such as diffusion-edited TOCSY), and multiple quantum filtering. Detailed $^1H$ NMR spectroscopic data for a wide range of metabolites and biomolecules found in biofluids have been published (see, for example, Lindon et al., 1999) and supplementary information is available in several literature compilations of data (see, for example, Fan, 1996; Sze et al., 1994).

For example, the successful application of $^1H$ NMR spectroscopy of biofluids to study a variety of metabolic diseases and toxic processes has now been well established and many novel metabolic markers of organ-specific toxicity have been discovered (see, for example, Nicholson et al., 1989; Lindon et al., 1999). For example, NMR spectra of urine is identifiably altered in situations where damage has occurred to the kidney or liver. It has been shown that specific and identifiable changes can be observed which distinguish the organ that is the site of a toxic lesion. Also it is possible to focus in on particular parts of an organ such as the cortex of the kidney and even in favourable cases to very localised parts of the cortex. Finally it is possible to deduce the biochemical mechanism of the xenobiotic toxicity, based on a biochemical interpretation of the changes in the urine. A wide range of toxins has now been investigated including mostly kidney toxins and liver toxins, but also testicular toxins, mitochondrial toxins and muscle toxins.

However, a limiting factor in understanding the biochemical information from both 1D and 2D-dimensional NMR spectra of tissues and biofluids is their complexity. The most efficient way to investigate these complex multiparametric data is employ the 1 D and 2D NMR metabonomic approach in combination with computer-based "pattern recognition" (PR) methods and expert systems. These statistical tools are similar to those currently being explored by workers in the fields of genomics and proteomics.

Pattern recognition (PR) is a general term applied to methods of data analysis which can be used to generate scientific hypotheses as well as testing hypotheses by reducing mathematically the many parameters.

PR methods may be conveniently classified as "supervised" or "unsupervised." Unsupervised methods are used to analyse data without reference to any other independent knowledge, for example, without regard to the identity or nature of a xenobiotic or its mode of action.

Examples of unsupervised pattern recognition methods include principal component analysis (PCA), hierarchical cluster analysis (HCA), and non-linear mapping (NLM).

One of the most useful and easily applied unsupervised PR techniques is principal components analysis (PCA) (see, for example, Sharaf, 1986). Principal components (PCs) are new variables created from linear combinations of the starting variables with appropriate weighting coefficients. The properties of these PCs are such that: (i) each PC is orthogonal to (uncorrelated with) all other PCs, and (ii) the first PC contains the largest part of the variance of the data set (information content) with subsequent PCs containing correspondingly smaller amounts of variance, A data matrix, X, made up of rows where each row defines a sample, and columns, where each column defines a particular spectral descriptor, can be regarded as composed of a scores matrix, T, and a loadings matrix, L, such that $X=TL^t$, where t denotes the transpose. The covariance matrix, C, is calculated from the data matrix, X. The eigenvalues and eigenvectors of the covariance matrix are determined by diagonalisation. The coordinates in eigenvector plots (the principal components, PCs) are denoted "scores" and comprise the scores matrix T. The eigenvector coefficients are denoted "loadings" and comprise the loadings matrix L, and give the contributions of the descriptors to the PCs.

Thus a plot of the first two or three PC scores gives the "best" representation, in terms of information content, of the data set in two or three dimensions, respectively. A plot of the first two principal component scores, PC1 and PC2, is often called a "scores plot", and provides the maximum information content of the data in two dimensions. Such PC maps can be used to visualise inherent clustering behaviour for drugs and toxins acting on each organ according to toxic mechanism, Of course, the clustering information might be in lower PCs and these have also to be examined.

In this simple metabonomic approach, a sample from an animal treated with a compound of unknown toxicity is compared with a database of NMR-generated metabolic data from control and toxin-treated animals. By observing its position on the PR map relative to samples of known effect, the unknown toxin can often be classified. However, toxicological data are often more complex, with time-related development of lesions and associated shifts in NMR-detected biochemistry. Also, it is more rigorous to compare effects of xenobiotics in the original n-dimensional NMR metabonomic space.

Hierarchical Cluster Analysis, another unsupervised pattern recognition method, permits the grouping of data points which are similar by virtue of being "near" to one another in some multi-dimensional space whose coordinates are defined by the NMR descriptors which may be, for example, the signal intensities for particular assigned peaks in an NMR spectrum. A "similarity matrix," S, is constructed with elements $s_{ij}=1-r_{ij}/r_{ij}^{max}$, where $r_{ij}$ is the interpoint distance between points i and j (e.g., Euclidean interpoint distance), and $r_{ij}^{max}$ is the largest interpoint distance for all points. The most distant pair of points will have $s_{ij}$ equal to 0, since $r_{ij}$ then equals $r_{ij}^{max}$. Conversely, the closest pair of points will have the largest $s_{ij}$, approaching 1.

The similarity matrix is scanned for the closest pair of points. The pair of points are reported with their separation distance, and then the two points are deleted and replaced with a single combined point. The process is then repeated iteratively until only one point remains. A number of different methods may be used to determine how two clusters will be joined, including the nearest neighbour method (also known as the single link method), the furthest neighbour method, the centroid method (including centroid link, incremental link, median link, group average link, and flexible link variations).

The reported connectivities are then plotted as a dendrogram (a tree-like chart which allows visualisation of clustering), showing sample—sample connectivities versus increasing separation distance (or equivalently, versus decreasing similarity). The dendrogram has the property in which the branch lengths are proportional to the distances between the various clusters and hence the length of the branches linking one sample to the next is a measure of their similarity. In this way, similar data points may be identified algorithmically.

Non-linear mapping (NLM) involves calculation of the distances between all of the points in the original multi-dimensional space. This is followed by construction of a map of points in 2 or 3 dimensions where the sample points are placed in random positions or at values determined by a prior principal components analysis. The least squares criterion is used to move the sample points in the lower dimension map to fit the inter-point distances in the lower dimension space to those in the higher dimensional space. Non-linear mapping is therefore an approximation to the true inter-point distances, but points close in the original multi-dimensional space should also be close in 2 or 3 dimensional space (see, for example, Brown et al., 1996; Farrant et al., 1992).

Alternatively, and in order to develop automatic classification methods, it has proved efficient to use a "supervised" approach to NMR data analysis. Here, a "training set" of NMR metabonomic data is used to construct a statistical model that predicts correctly the "class" of each sample. This training set is then tested with independent data ("test set") to determine the robustness of the computer-based model. These models are sometimes termed "Expert Systems," but may be based on a range of different mathematical procedures. Supervised methods can use a data set with reduced dimensionality (for example, the first few principal components), but typically use unreduced data, with full dimensionality. In all cases the methods allow the quantitative description of the multivariate boundaries that characterise and separate each class, for example, each class of xenobiotic in terms of its metabolic effects. It is also possible to obtain confidence limits on any predictions, for example, a level of probability to be placed on the goodness of fit (see, for example, Sharaf, 1986). The robustness of the predictive models can also be checked using cross-validation, by leaving out selected samples from the analysis.

Expert systems may operate to generate a variety of useful outputs, for example, (i) classification of the sample as "normal" or "abnormal" (this is a useful tool in the control of spectrometer automation using sequential flow injection NMR spectroscopy); (ii) classification of the target organ for toxicity and site of action within the tissue where in certain cases, mechanism of toxic action may also be classified; and, (iii) identification of the biomarkers of a pathological disease condition or toxic effect for the particular compound under study. For example, a sample can be classified as belonging to a single class of toxicity, to multiple classes of toxicity (more than one target organ), or to no class. The latter case would indicate deviation from normality (control) based on the training set model but having a dissimilar metabolic effect to any toxicity class modelled in the training set (unknown toxicity type). Under (ii), a system could also be generated to support decisions in clinical medicine (e.g., for efficacy of drugs) rather than toxicity.

Examples of supervised pattern recognition methods include the following, which are briefly described below: soft independent modelling of class analysis (SIMCA) (see, for example, Wold, 1976); partial least squares analysis (PLS) (see, for example, Wold, 1966; Joreskog, 1982; Frank, 1984); linear descriminant analysis (LDA) (see, for example, Nillson, 1965); K-nearest neighbour analysis (KNN) (see, for example, Brown et al., 1996); artificial neural networks (ANN) (see, for example, Wasserman, 1989; Anker et al., 1992; Hare, 1994); probabilistic neural networks (PNNs) (see, for example, Parzen, 1962; Bishop, 1995; Speckt, 1990; Broomhead et al., 1988; Patterson, 1996); rule induction (RI) (see, for example, Quinlan, 1986); and, Bayesian methods (see, for example, Bretthorst, 1990).

As the size of metabonomic databases increases together with improvements in rapid throughput of NMR samples (>300 samples per day per spectrometer is now possible with the first generation of flow injection systems), more subtle expert systems may be necessary, for examples using techniques such as "fuzzy logic" which permit greater flexibility in decision boundaries.

Pattern recognition methods have been applied to the analysis of metabonomic data, including, for example, complex NMR data, with some success (see, for example, Anthony et al., 1994; Anthony et al., 1995; Beckwith-Hall et al., 1998; Gartland et al., 1990a; Gartland et al., 1990b; Gartland et al., 1991; Holmes et al., 1998a; Holmes et al., 1998b; Holmes et al., 1992; Holmes et al., 1994; Spraul et al., 1994; Tranter et al., 1999).

Although the utility of the metabonomic approach is well established, there remains a great need for improved methods of analysis. The metabolic variation is often subtle, and powerful analysis methods are required for detection of particular analytes, especially when the data (e.g., NMR spectra) are so complex.

One aim of the present invention is to provide data analysis methods for the detection of such metabolic variations, as part of a metabonomic approach.

SUMMARY OF THE INVENTION

One aspect of the present invention pertains to improved methods for the analysis of chemical, biochemical, and biological data, for example spectra, for example, nuclear magnetic resonance (NMR) and other types of spectra.

One aspect of the invention pertains to a method for processing a sample spectrum comprising:

replacing each of one or more target regions in said sample spectrum with a corresponding replacement region of a master control spectrum to give a target-replaced sample spectrum, wherein said replacement region has been scaled so as to have the same fraction of the total integrated intensity in said target-replaced sample spectrum as it did in said master control spectrum.

One embodiment of the present invention pertains to a method for processing a sample spectrum for a test sample, said method comprising the steps of:

(a) identifying, in said sample spectrum, one or more target regions for replacement;

(b) providing a master control spectrum which comprises one replacement region corresponding to each of said target regions; and, (c) replacing each of said target regions with the corresponding replacement region to give a target-replaced sample spectrum, wherein said replacement region has been scaled so as to have the same fraction of the total integrated intensity in said target-replaced sample spectrum as it did in said master control spectrum.

In one embodiment of the present invention, the method further comprises the subsequent step of:

(d) normalising said target-replaced sample spectrum to give a normalised target-replaced sample spectrum.

One embodiment of the present invention pertains to a method for processing a sample NMR spectrum for a test sample, said method comprising the steps of:

(a) identifying, in said sample NMR spectrum, one or more target regions for replacement, wherein each of said target regions is defined by a chemical shift range;

(b) providing a master control NMR spectrum which comprises one replacement region corresponding to each of said target regions, wherein a target region and its corresponding replacement region are defined by the same chemical shift range; and, (c) replacing each of said target regions with the corresponding replacement region to give a target-replaced sample NMR spectrum, wherein said replacement region has been scaled so as to have the same fraction of the total integrated intensity in said target-replaced sample NMR spectrum as it did in said master control NMR spectrum.

In one embodiment of the present invention, the method further comprises the subsequent step of:

(d) normalising said target-replaced sample NMR spectrum to give a normalised target-replaced sample NMR spectrum.

In one embodiment of the present invention, in said replacing step (c), each of said target regions is replaced with the corresponding replacement region to give a target-replaced sample spectrum, wherein said replacement region has been scaled by a factor, f, given by the formula:

$$f = \frac{I_Y - \sum_k I_{Y,Tk}}{I_{CM} - \sum_k I_{CM,Rk}}$$

wherein:

$I_Y$ is the total integrated intensity of the sample spectrum;

$I_{Y,Tk}$ is the integrated intensity of the target region;

$I_{CM}$ is the total integrated intensity of the master control spectrum;

$I_{CM,Rk}$ is the integrated intensity of the replacement region;

k ranges from 1 to $n_t$; and, $n_t$ is number of target regions.

Another aspect of the invention pertains to a sample spectrum which has been processed by a method according to the present invention.

Another aspect of the invention pertains to a method for processing a plurality of sample spectra, comprising processing each of said sample spectra by a method according to the present invention.

Another aspect of the invention pertains to a method of analysis of an applied stimulus, comprising the steps of:

(a) providing one or more sample spectra for each of one or more samples from each of one or more organisms which have been subjected to said applied stimulus;

(b) providing a master control spectrum derived from one or more control spectra for each of one or more samples from each of one or more organisms which have not been subjected to said applied stimulus;

(c) processing each of said sample spectra using a method according to the present invention.

In one preferred embodiment, the applied stimulus is a xenobiotic. In one preferred embodiment, the applied stimulus is a disease state. In one preferred embodiment, the applied stimulus is a genetic modification.

Another aspect of the invention pertains to a method for identifying a biomarker or biomarker combination for an applied stimulus, comprising a method of analysis of an applied stimulus as described herein.

Another aspect of the invention pertains to a biomarker or biomarker combination identified by such a method.

Another aspect of the invention pertains to a method of diagnosis of an applied stimulus employing a biomarker identified by such a method.

Another aspect of the invention pertains to an assay, which employs a biomarker identified by a method as described herein.

Another aspect of the invention pertains to a method of classifying an applied stimulus, comprising a method of analysis of an applied stimulus as described herein.

Another aspect of the invention pertains to a method of diagnosis of an applied stimulus, comprising a method of analysis of an applied stimulus as described herein.

Another aspect of the invention pertains to a method of therapeutic monitoring of a subject undergoing therapy, comprising a method of analysis of an applied stimulus as described herein.

Another aspect of the invention pertains to a method of evaluating drug therapy and/or drug efficacy, comprising a method of analysis of an applied stimulus as described herein.

Another aspect of the invention pertains to a method of detecting toxic side-effects of drug, comprising a method of analysis of an applied stimulus as described herein.

Another aspect of the invention pertains to a method of characterising and/or identifying a drug in overdose, comprising a method of analysis of an applied stimulus as described herein.

In one preferred embodiment, the spectrum or spectra is an NMR spectrum or NMR spectra.

Another aspect of the invention pertains to a computer system operatively configured to implement a method according the present invention.

Another aspect of the invention pertains to computer code suitable for implementing a method according to the present invention.

Another aspect of the invention pertains to a data carrier which carries computer code suitable for implementing a method according the present invention on a suitable computer system.

As will be appreciated by one of skill in the art, features and preferred embodiments of one aspect of the invention will also pertain to other aspects of the invention.

and (iii) spectrum (ii) after re-normalisation.

Figure 7:
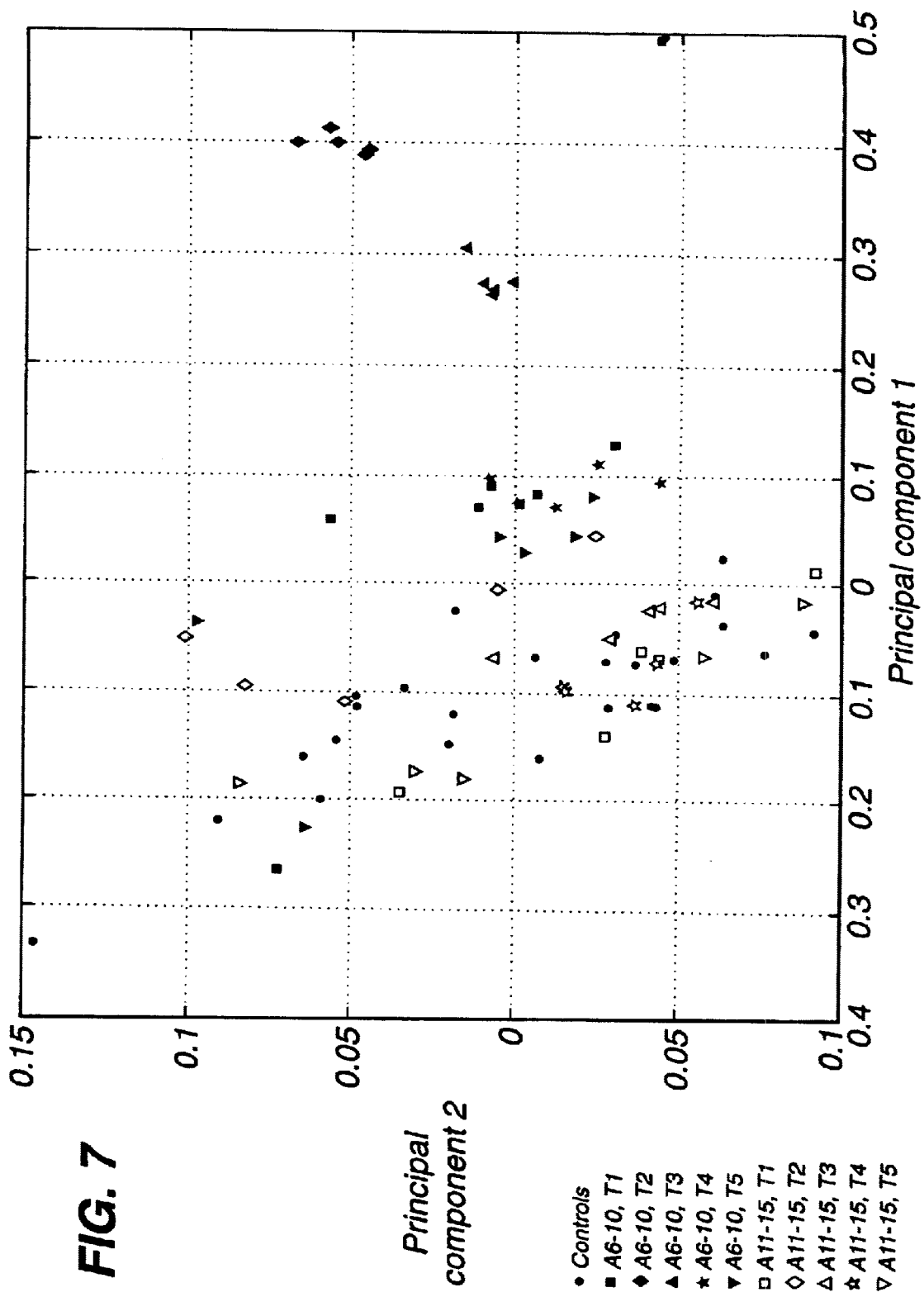

FIG. 7 is a graph showing a scores plot (principal component 1 versus principal component 2) following principal component analysis of the sample spectra, wherein the spectral regions associated with the interfering signal were deleted from all spectra.

Figure 8:
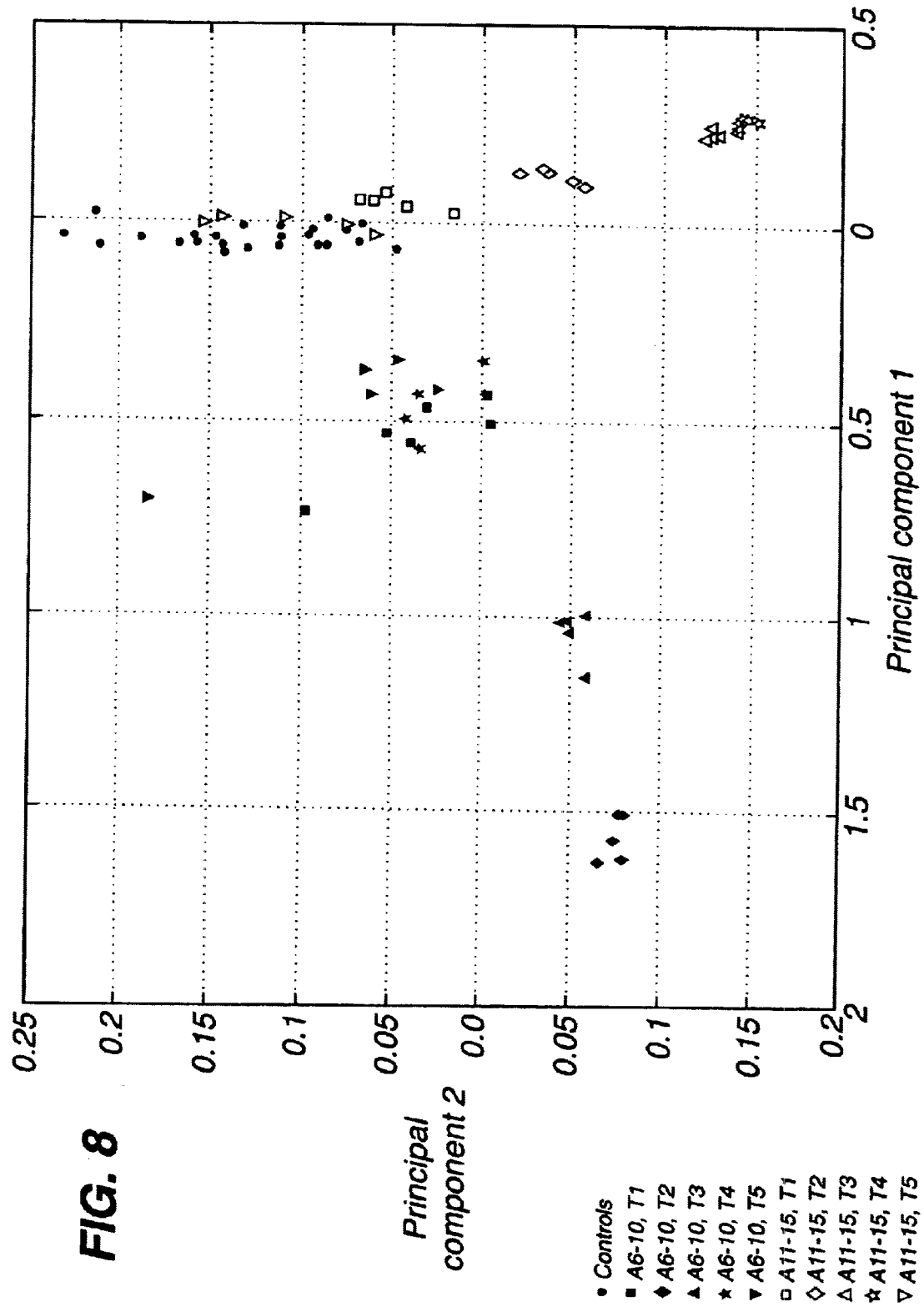

FIG. 8 is a graph showing a scores plot (principal component 1 versus principal component 2) following principal component analysis of the normalised target-replaced spectra, wherein the replaced regions were treated as "missing data."

Figure 9:
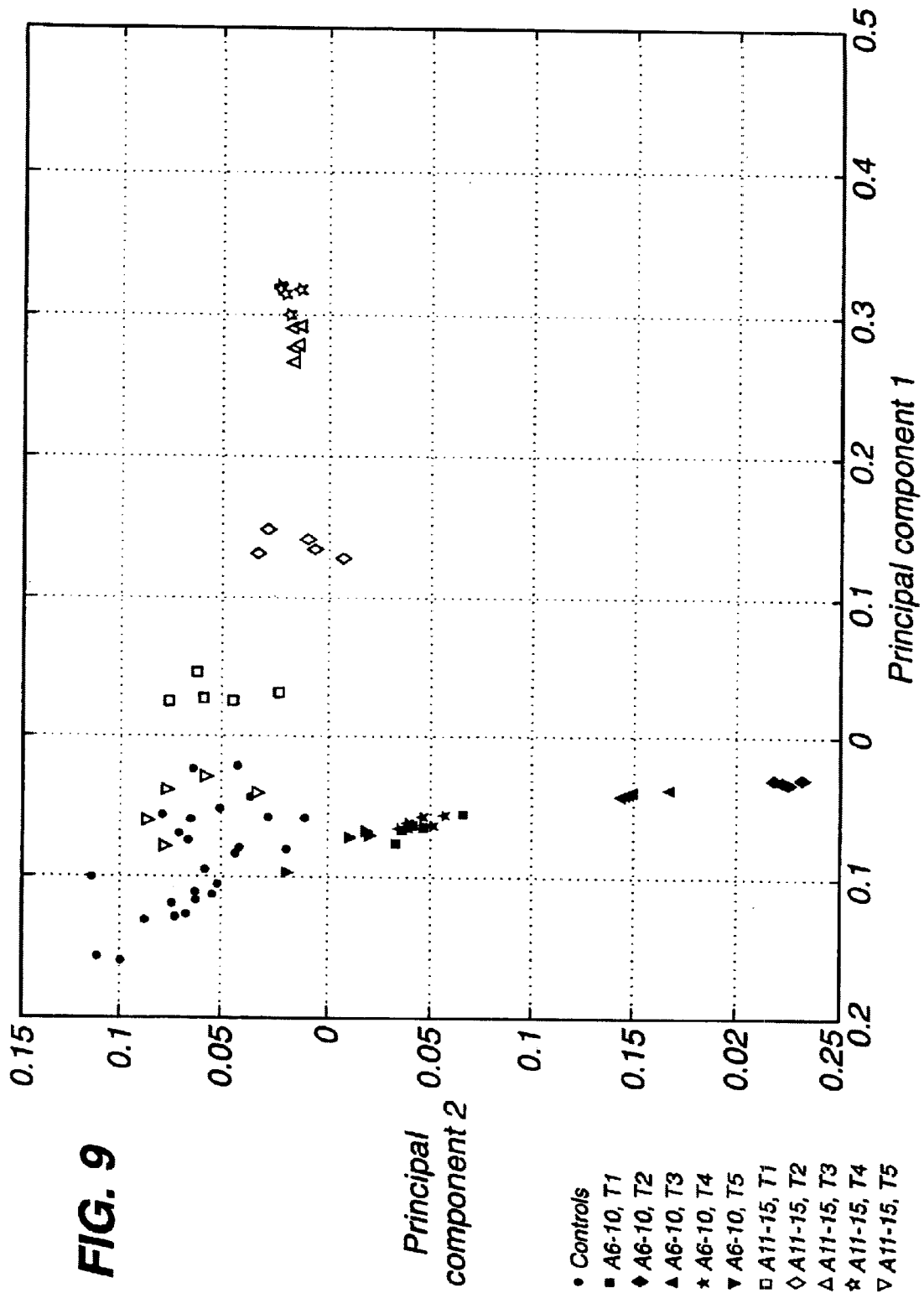

FIG. 9 is a graph showing a scores plot (principal component 1 versus principal component 2) following principal component analysis of the normalised target-replaced spectra, wherein the replaced regions were not treated as "missing data."

Figure 10:
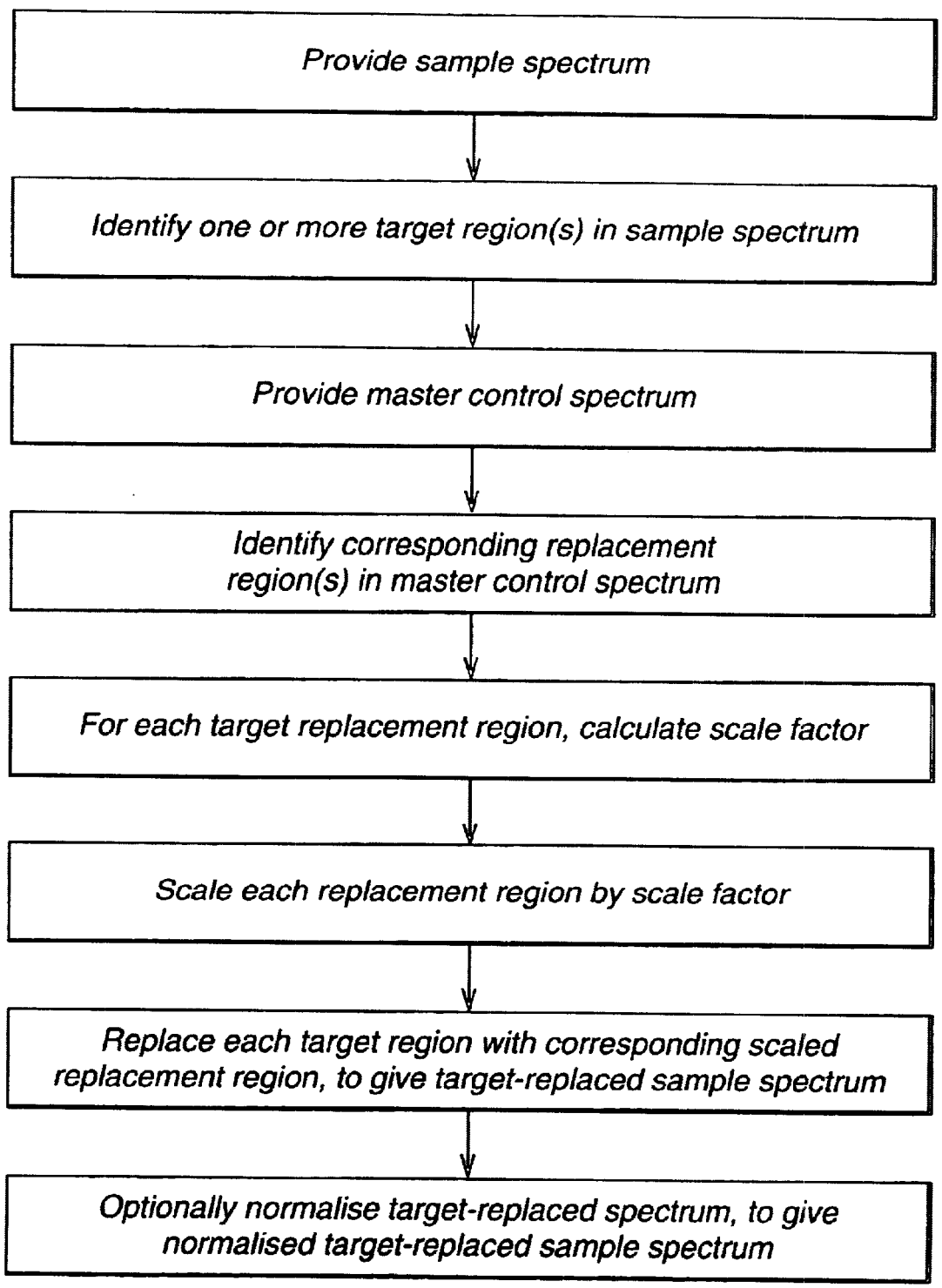

FIG. 10 is a flow chart illustrating one of the methods of the invention.

DETAILED DESCRIPTION OF THE INVENTION

The present invention pertains generally to the field of chemometrics, metabonomics, and, more particularly, to methods for the analysis of biological data, particularly spectra.

Biological Data

The methods of the present invention are applicable to chemical, biochemical, and biological data, for example, spectra, and especially spectra generated using types of spectroscopy and spectrometry which are useful in chemical and biochemical (i.e., molecular) studies.

The methods described herein facilitate more powerful analysis of spectral data. For example, the methods of the present invention make possible the identification of spectral changes associated with an event of interest from a spectral background which is non-specific and/or irrelevant.

In the context of studies of organisms, the event of interest may be, for example, an applied stimulus. The term "applied stimulus," as used herein, pertains to a stimulus under study which is applied to, or is present in, an organism(s) under study, and is not applied to, and is absent in, a control organism(s). Examples of applied stimuli include, but are not limited to, a xenobiotic, a disease state, and a genetic modification.

The term "xenobiotic," as used herein, pertains to a substance (e.g., compound, composition) which is administered to an organism, or to which the organism is exposed. In general, xenobiotics are chemical, biochemical or biological molecules which are not normally present in that organism, or are normally present in that organism, but not at the level obtained following administration. Examples of xenobiotics include drugs, formulated medicines and their components, pesticides, herbicides, substances present in foods (e.g. plant compounds administered to animals), and substances present in the environment.

The term "disease state," as used herein, pertains to a deviation from the normal healthy state of the organism. Examples of disease states include bacterial, viral, parasitic infections, cancer in all its forms, degenerative diseases (e.g., arthritis, multiple sclerosis), trauma (e.g., as a result of injury), organ failure (including diabetes), cardiovascular disease (e.g., atherosclerosis, thrombosis), and inherited diseases caused by genetic composition (e.g., sickle-cell anaemia).

The term "genetic modification," as used herein, pertains to alteration of the genetic composition of an organism. Examples of genetic modifications include the incorporation of a gene or genes into an organism from another species, increasing the number of copies of an existing gene or genes in an organism, removal of a gene or genes from an organism, rendering a gene or genes in an organism non-functional.

Examples of the types of spectroscopy which give spectra suitable for the application of the methods of the present invention include, but are not limited to, the following: all regions of the electromagnetic spectrum, including, for example, microwave spectroscopy; far infrared spectroscopy; infrared spectroscopy; Raman and resonance Raman spectroscopy; visible spectroscopy; ultraviolet spectroscopy; far ultraviolet (or vacuum ultraviolet) spectroscopy; x-ray spectroscopy; optical rotatory dispersion, circular dichroism (e.g., ultraviolet, visible and infrared); Mossbauer spectroscopy; atomic absorption and emission spectroscopy; ultraviolet fluorescence and phosphorescence spectroscopy; magnetic resonance, including nuclear magnetic resonance (NMR), electron paramagnetic resonance (EPR), MRI (magnetic resonance imaging); and mass spectrometry, including variations of ionization methods, including electron impact, chemical ionisation, thermospray, electrospray, matrix assisted laser desorption ionization (MALDI), inductively coupled plasma, and detection methods, including sector detection, quadrupole detection, ion-trap, time-of-flight, and Fourier transform.

One particularly preferred class of spectroscopy is nuclear magnetic resonance (NMR). Examples of such methods include 1D, 2D, and 3D-NMR, including, for example, 1D spectra, such as single pulse, water-peak saturated, spin-echo such as CPMG (i.e., edited on the basis of nuclear spin relaxation times), diffusion-edited; 2D spectra, such as J-resolved (JRES), $^1H$-$^1H$ correlation methods such as NOESY, COSY, TOCSY and variants thereof, methods which correlated 1H to heteronuclei (including, for example, $^{13}C$, $^{15}N$, $^{19}F$, and 31P), such as direct detection methods such as HETCOR and inverse-detected methods such as $^1H$-$^{13}C$ HMQC, HSQC and HMBO; 3D spectra, including many variants, which are combinations of 2D methods, e.g. HMQC-TOCSY, NOESY-TOCSY, etc. All of these NMR spectroscopic techniques can also be combined with magic-angle-spinning (MAS) in order to study samples other than isotropic liquids, such as tissues or foodstuffs, which are characterised by anisotropic composition.

Composite spectra, which are formed from two or more spectra of different types, may also be used The methods of the present invention are applied to spectra obtained or recorded for particular samples under study. Samples may be in any form which is compatible with the particular type of spectroscopy, and therefore may be, as appropriate, homogeneous or heterogeneous, comprising one or a combination of, a gas, a liquid, a liquid crystal, a gel, or a solid, and including samples with a biological origin.

Examples of such samples include those originating from an organism, for example, a whole organism (living or dead, e.g., a living human, a culture of bacteria); a part or parts of an organism (e.g., a tissue sample, an organ, a leaf); a pathological tissue such as a tumour; a tissue homogenate (e.g. a liver microsome fraction); an extract prepared from a organism or a part of an organism (e.g., a tissue sample extract, such as perchloric acid extract); an infusion prepared from a organism or a part of an organism (e.g., tea, Chinese traditional herbal medicines); an in vitro tissue such as a spheroid; a suspension of a particular cell type (e.g. hepatocytes); an excretion, secretion, or emission from an organism (especially a fluid); material which is administered and collected (e.g., dialysis fluid, lung aspirate fluid); material which develops as a function of pathology (e.g., a cyst, blisters), supernatant from a cell culture.

Examples of fluid samples include, for example, urine, (gall bladder) bile, blood plasma, whole blood, cerebrospinal fluid, milk, saliva, mucus, sweat, gastric juice, pancreatic juice, seminal fluid, prostatic fluid, seminal vesicle fluid, seminal plasma, amniotic fluid, foetal fluid, follicular fluid, synovial fluid, aqueous humour, ascite fluid, cystic fluid, and blister fluid, plus cell suspensions and extracts thereof.

Examples of tissue samples include liver, kidney, prostate, brain, gut, blood, skeletal muscle, heart muscle, lymphoid, bone, cartilage, and reproductive tissues.

Still other examples of samples include air (e.g., exhaust), air condensates or extracts, water (e.g., seawater, groundwater, wastewater, e.g., from factories), liquids from the food industry (e.g. juices, wines, beers, other alcoholic drinks, tea, milk), solid-like food samples (e.g. chocolate, pastes, fruit peel, fruit and vegetable flesh such as banana, leaves, meats, whether cooked or raw, etc.).

The sample may also be a concentrate of a fluid, for example, a concentrate of a fluid described above.

For samples which are, or are drawn from, an organism, the organism, in general, may be a prokaryote (e.g., bacteria) or a eukaryote (e.g., protoctista, fungi, plants, animals).

The organism may be an alga or a protozoan.

The organism may be a plant, an angiosperm, a dicotyledon, a monocotyledon, a gymnosperm, a conifer, a ginkgo, a cycad, a fern, a horsetail, a clubmoss, a liverwort, or a moss.

The organism may be a chordate, an invertebrate, an echinoderm (e.g., starfish, sea urchins, brittlestars), an arthropod, an annelid (segmented worms) (e.g., earthworms, lugworms, leeches), a mollusk (cephalopods (e.g., squids, octopi), pelecypods (e.g., oysters, mussels, clams), gastropods (e.g., snails, slugs)), a nematode (round worms), a platyhelminthes (flatworms) (e.g., planarians, flukes, tapeworms), a cnidaria (e.g., jelly fish, sea anemones, corals), or a porifera (e.g., sponges).

The organism may be an arthropod, an insect (e.g., beetles, butterflies, moths), a chilopoda (centipedes), a diplopoda (millipedes), a crustacean (e.g., shrimps, crabs, lobsters), or an arachnid (e.g., spiders, scorpions, mites), The organism may be a chordate, a vertebrate, a mammal, a bird, a reptile (e.g., snakes, lizards, crocodiles), an amphibian (e.g., frogs, toads), a bony fish (e.g., salmon, plaice, eel, lungfish), a cartilaginous fish (e.g., sharks, rays), or a jawless fish (e.g., lampreys, hagfish).

The organism may be a mammal, a placental mammal, a marsupial (e.g., kangaroo, wombat), a monotreme (e.g., duckbilled platypus), a rodent (e.g., a guinea pig, a hamster, a rat, a mouse), murine (e.g., a mouse), avian (e.g., a bird), canine (e.g., a dog), feline (e.g., a cat), equine (e.g., a horse), porcine (e.g., a pig), ovine (e.g., a sheep), bovine (e.g., a cow), a primate, simian (e.g., a monkey or ape), a monkey (e.g., marmoset, baboon), an ape (e.g., gorilla, chimpanzee, orangutang, gibbon), or a human, Furthermore, the organism may be any of its forms, for example, a spore, a seed, an egg, a larva, a pupa, or a foetus.

Spectral Replacement

Spectra often have features (e.g. peaks, noise spikes, baseline artefacts, etc) which interfere with and/or reduce the power and/or accuracy of subsequent analysis. Some of these features are artefacts of the particular types of spectra, its method of acquisition, adventitious impurities, and the like. However, more often these spectral features are chemical species not accidentally or unintentionally present in the sample under study. In order to improve the power and efficiency of subsequently spectral analysis, it is useful to identify and treat appropriately those parts of the spectra which are associated with such species. In addition, spectral features introduced unintentionally need to identified and treated appropriately.

For example, in metabonomic studies, a sample from an organism under study may show spectral evidence of a large number of metabolites, some of which provide little or no useful information about the applied stimulus, yet interfere with subsequent data analysis. For example, spectral peaks from drugs and their metabolites often dominate the metabonomic description of the dosed organism, but their identification and levels are sometimes of secondary importance.

In general, metabolites may be placed in one of three classes:

(A) Endogenous metabolites, the levels of which are significantly altered by the application of the applied stimulus. A single metabolite of this type is typically referred to as a biomarker. In a more complex case, where the levels of several, or more, metabolites are changed (whether increased or decreased), the group of metabolites are typically referred to as a biomarker combination. For example, an increase in taurine together with creatine levels in urine is a general marker for liver damage. In a more complex example, toxins which cause lesions in the S3 portion of the renal proximal tubule cause elevations of urinary glucose, amino acids and organic acids with decreases in tricarboxylic acid cycle intermediates.

(B) Endogenous metabolites, the levels of which are unaffected by application of the applied stimulus.

(C) Metabolites, which appear in the sample and which arise from a xenobiotic itself or its metabolites. For example, paracetamol is seen in urine mainly as paracetamol sulfate and paracetamol glucuronide conjugates. In some cases unchanged paracetamol can also be seen. Of course, these metabolites will be present only if the applied stimulus includes a xenobiotic.

Metabolites falling in class B, and many of those metabolites falling in class C, i.e. not biomarkers or biomarker combinations, collectively referred to herein as "interfering signals", often provide little information about the organism's response to an applied stimulus, while dominating and interfering with the metabonomic description of the stimulated organism.

Whether or not a particular metabolite is, or is a candidate as, an interfering signal can often be determined from known data regarding the applied stimulus under study. For example, there may be a large body of public knowledge regarding the metabolism of a particular compound, or of compounds having a particular substructure. Often, an interfering signal, and its associated spectral features, can be readily identified by eye by the skilled artisan. However, if new spectral features are observed which are not readily identified, the associated compounds giving rise to these features can be isolated and characterised using known methods, for example, by coupling liquid chromatography with NMR or mass spectrometry.

In some methods, those parts of the spectrum associated with these interfering signals are excised. However, when comparing or combining data from several studies (e.g., using different xenobiotics, different disease states, etc.), these parts of the spectrum are effectively deleted from all spectra in a combined data set. The deleted regions can encompass a large fraction of the total spectral region, significantly reducing the information content of the combined set of spectra, and thereby reducing the power and efficiency of subsequently applied pattern recognition methods.

In some known methods, the excised parts of the spectrum are "filled," for example, by replacing the excised spectral data with, for example, zero intensity values ("zero fill"); with an arbitrary or predetermined constant intensity value ("constant fill"); a random intensity value ("random fill"); a mean intensity value ("mean fill") calculated from the entire dataset; or an intensity value based on a principal component analysis ("principal component fill").

However, rather than simply deleting, or deleting and subsequently filling, these spectral regions, it is desirable to employ a method of "spectral replacement" in which these spectral regions are replaced with meaningful data, for example, corresponding scaled spectral regions from normal or control spectra (e.g., in the case of organism studies, spectra associated with normal or control organisms). Subsequent normalisation may further improve the data content, by scaling the peak intensities to values which, in a sense, they would have had if the interfering features (e.g. peaks) had not been included.

Therefore, whether for the metabonomic reasons discussed above, or for other reasons, the spectrum is subjected to the additional step of "spectral replacement" as described herein. In general, spectral replacement is performed following acquisition of the spectrum (or spectra), including the normal pre-processing associated with the particular type of spectrum (e.g., signal averaging, Fourier transformation, baseline correction, etc.), but before subsequent analysis.

One aspect of the present invention pertains to a method for processing a sample spectrum comprising replacing each of one or more target regions in said sample spectrum with the corresponding replacement region of a master control spectrum to give a target-replaced sample spectrum, wherein the replacement region has been scaled so as to have the same fraction of the total integrated intensity in said target-replaced sample spectrum as it did in said master control spectrum.

Thus, one embodiment of the present invention pertains to a method for processing a sample spectrum for a test sample, said method comprising the steps of:

(a) identifying, in said sample spectrum, one or more target regions for replacement;

(b) providing a master control spectrum which comprises one replacement region corresponding to each of said target regions; and, (c) replacing each of said target regions with the corresponding replacement region to give a target-replaced sample spectrum, wherein said replacement region has been scaled so as to have the same fraction of the total integrated intensity in the target-replaced sample spectrum as it did in the master control spectrum.

In a preferred embodiment, the methods further comprise a subsequent step of:

(d) normalising said target-replaced sample spectrum to give a normalised target-replaced sample spectrum.

Another embodiment of the present invention pertains to a method for processing a sample NMR spectrum for a test sample, said method comprising the steps of:

(a) identifying, in said sample NMR spectrum, one or more target regions for replacement, wherein each of said target regions is defined by a chemical shift range;

(b) providing a master control NMR spectrum which comprises one replacement region corresponding to each of said target regions, wherein a target region and its corresponding replacement region are defined by the same chemical shift range, and, (c) replacing each of said target regions with the corresponding replacement region to give a target-replaced sample NMR spectrum, wherein said replacement region has been scaled so as to have the same fraction of the total integrated intensity in said target-replaced sample NMR spectrum as it did in said master control NMR spectrum.

In a preferred embodiment, the methods further comprise a subsequent step of:

(d) normalising said target-replaced sample NMR spectrum to give a normalised target-replaced sample NMR spectrum.

Note that, in each of the above methods, step (b) may be performed either before or after step (a).

The term "sample spectrum," as used herein, pertains to an spectrum obtained from a sample under study. If there are several sample spectra, as is typically the case, each one is treated separately.

The sample spectrum is, to one degree or another, representative of the composition of the sample. In general, a sample can be generalised as an n-dimensional object, where the coordinate along each of the axes or dimensions is the concentration of individual chemical or biochemical species. Equivalently, the sample can be represented via its spectrum, also as an n-dimensional object, y, where the coordinate along each of the axes or dimensions $(y_1, Y_2, y_3, \ldots y_j)$ is the spectral intensity (or equivalent parameter) at each data point. For example, for a 1D NMR spectrum, each of $y_1, Y_2, y_3$, etc. may represent signal intensity at different chemical shifts. It is not necessary to assign spectral features (e.g., peaks, features, lines) at this stage, since it is treated solely as a statistical object.

A sample spectra set, Y, may be formed from $n_y$ sample spectra, each of which is denoted $y_I$ (where i runs from 1 to $n_y$) and each of which has descriptors $y_{ij}$ (where ranges from 1 to the total number of descriptors). Each sample spectrum, i, has a total integrated intensity, $I_{Yi}$, given by:

$$I_{Yi} = \sum_j y_{ij}$$

As mentioned above, the target regions are one or more spectral regions in the sample spectrum which are to be replaced, Each of one or more target regions in the sample spectrum is replaced with the corresponding and appropriately scaled replacement region of a master control spectrum. The target regions for the ith sample spectrum may be denoted $t_{i,k}$, where k ranges from 1 to $n_t$, and $n_t$ is the number of target regions. In metabonomic studies, the target regions typically pertain to, relate to, or otherwise reflect low correlation metabolites, as discussed above.

The master control spectrum may be a single spectrum, referred to herein as a "control spectrum," or more preferably it is an average spectrum calculated from two or more control spectra. Where the spectra are associated with an organism, the master control spectrum may be a single spectrum from a control organism, referred to herein as a "control spectrum," or more preferably it is an average spectrum calculated from two or more control spectra. The control spectra may be obtained from a single control organism, or, more preferably, from two or more control organisms. In the context of studies of organisms, the stimulus under study is not applied to, nor is present in, the control organism(s). For example, a control spectra set, C, may be formed from $n_c$ control spectra, each of which is denoted $c_I$ and has descriptors $c_{ij}$, where j runs between 1 and the number of descriptors. The master control spectrum, $c_M$, having descriptors $C_{Mj}$, may be calculated as:

$$c_{Mj} = \frac{1}{n_c} \sum_i c_{ij}$$

The master control spectrum has a total integrated intensity, $I_{CM}$, given by:

$$I_{CM} = \sum_j c_{Mj}$$

The master control NMR spectrum comprises one replacement region corresponding to each of the target regions. The term "replacement region(s)," as used herein, pertains to that part/those parts of the master control spectrum which correspond(s) to the target region(s) of the sample spectrum. For example, if the spectrum is a 1D NMR spectrum, and a particular target region is defined as δ 7.2–7.7 in the sample NMR spectrum, then the corresponding replacement region is also defined as δ 7.2–7.7 in the master control NMR spectrum.

Each replacement region(s) is scaled so that it represents the same fraction of the total integrated intensity in the target-replaced sample spectrum as it did in the master control spectrum. For example, if a replacement region represented 2% of the total intensity in the master control spectrum, then it must also account for 2% of the total intensity in the target-replaced sample spectrum.

For example, consider the case where the sample spectrum, with integrated intensity $I_Y$, has a single target region with integrated intensity $I_T$. The remainder of the spectrum has an integrated intensity of $I_Y-I_T$. The master control spectrum has an integrated intensity of $I_{CM}$, and the replacement region therein has an integrated intensity of $I_R$. The fraction of the total integrated intensity in the master control spectrum accounted for by the replacement region is $I_R/R_{CM}$. The replacement region is scaled by a factor, f, and thus the scaled replacement region has an integrated intensity of $fI_R$. The target replaced spectrum now has an integrated intensity of $I_Y-I_T+fI_R$.

The scale factor, f, is selected so that scaled replacement region (intensity $fI_R$) has the same fraction of the total integrated intensity in the target-replaced sample spectrum $(fI_R/[fI_R+I_Y-I_T])$ as it did in the master control spectrum $(I_R/I_{CM})$, that is, $fI_R/[fI_R+I_Y-I_T]=I_R/I_{CM}$. Rearranging this equation gives:

$$f = \frac{I_Y - I_T}{I_{CM} - I_R}$$

Consider also the case where the sample spectrum, with integrated intensity $I_Y$, has two target region with integrated intensities $I_{T1}$ and $I_{T2}$, respectively. The remainder of the spectrum has an integrated intensity of $I_Y-I_{T1}-I_{T2}$. The master control spectrum has an integrated intensity of $I_{CM}$, and the respective replacement regions therein have integrated intensities of $I_{R1}$ and $I_{R2}$, respectively. The fraction of the total integrated intensity in the master control spectrum accounted for by the first and second replacement regions is $I_{R1}/I_{CM}$ and $I_{R2}/I_{CM}$, respectively. The first replacement region is scaled by a factor, $f_1$, and thus the scaled first replacement region has an integrated intensity of $f_1I_{R1}$. The second replacement region is scaled by a factor, $f_2$, and thus the scaled second replacement region has an integrated intensity of $f_2I_{R2}$. The target replaced spectrum now has an integrated intensity of $I_Y-I_T+f_1I_{R1}+f_2I_{R2}$.

The scale factors, $f_1$ and $f_2$, are selected so that each scaled replacement region (intensities $f_1I_{R1}$ and $f_2I_{R2}$, respectively) has the same fraction of the total integrated intensity in the target-replaced sample spectrum $(f_1I_{R1}/[I_Y-I_T+f_1I_{R1}+f_2I_{R2}]$ and $f_2I_{R2}/[I_Y-I_T+f_1I_{R1}+f_2I_{R2}]$, respectively) as it did in the master control spectrum ($I_{R1}/I_{CM}$ and $I_{R2}/I_{CM}$, respectively). This gives two simultaneous equations: $f_1I_{R1}/$ $[I_Y-I_T+f_1I_{R1}+f_2I_{R2}]=I_{R1}/I_{CM}$ and $f_2I_{R2}/[I_Y-I_T+f_1I_{R1}+f_2I_{R2}]=I_{R2}/I_{CM}$, from which it can be shown that:

$$f_1 = f_2 = f = \frac{I_Y - I_{T1} - I_{T2}}{I_{CM} - I_{R1} - I_{R2}}$$

In the general case, the target regions for the ith sample spectrum ($Y_i$) are denoted $t_{I,k}$, the corresponding replacement regions are denoted $r_k$, and in both cases, k ranges from 1 to $n_t$, where $n_t$ is the number of target regions.

For the kth target region of the ith sample spectrum, denoted $t_{I,k}$, the integrated intensity, $I_{Yi,Tk}$ is calculated as:

$$I_{Yi,Tk} = \sum_j y_{ij}$$

where the sum is over the descriptors, j, of that target region.

Similarly, for the replacement region of the master control spectrum, denoted $r_k$ (corresponding to the kth target region of the ith sample spectrum, $t_{I,k}$), the integrated intensity is calculated as:

$$I_{CM,Rk} = \sum_j c_{Mj}$$

where the sum is over the descriptors, j, of that replacement region.

Thus, generalising the above examples, it may be shown that where there are many target regions, the scale factor for the ith sample spectrum is given by:

$$f_i = \frac{I_{Yi} - \sum_k I_{Yi,Tk}}{I_{CM} - \sum_k I_{CM,Rk}}$$

wherein:

$I_{Yi}$ is the total integrated intensity of the sample spectrum (before replacement);

$I_{Yi,Tk}$ is the integrated intensity of the target region in question;

$I_{CM}$ is the total integrated intensity of the master control spectrum;

$I_{CM,Rk}$ is the integrated intensity of the replacement region in question; and, and k ranges from 1 to $n_t$, the number of target regions.

Thus, prior to replacement of the target region, $y_{I,k}$, by its corresponding replacement region, $r_k$, that replacement region is scaled by (i.e., multiplied by) a factor, $f_i$, given above. In this way, for each sample spectrum and for each target region therein, a target region, $Y_{I,k}$, of integrated intensity $I_{Yi,Rk}$ is replaced by a replacement region, $r_k$, of integrated intensity $f_i I_{CM,Rk}$.

The fourth step of the method, which is optional, but which is preferred, involves normalising the target-replaced sample spectrum to give a "normalised target-replaced sample spectrum," Normalisation is typically achieved by scaling the target-replaced sample spectrum to give unit total integrated intensity, that is, by scaling by a factor of 1 divided by the total integrated intensity of the target-replaced sample spectrum, and thus may be expressed by the following formula:

$$y_{ij}^{R,N} = \frac{y_{ij}^R}{\sum_j y_{ij}^R}$$

wherein $y_{ij}^R$ denotes the descriptors of the target-replaced sample spectrum, and $y_{ij}^{R,N}$ denotes the descriptors of the normalised target-replaced sample spectrum.

Once the spectra have been processed as described above, they may be subjected to further analysis as appropriate for the particular type of spectrum. A variety of known analysis methods may be employed, including, for example, those described in Press et al., 1983.

For example, for NMR spectra, conventional pattern recognition methods such as principal component analysis (PCA) may be applied. For example, it may be desirable to perform PCA using target-replaced spectra, or, more preferably, normalised target-replaced spectra. Similarly, it may or may not be desirable to treat the target-replaced regions as "missing data."

Implementation

The methods of the present invention may be conveniently performed electronically, for example, using a suitably programmed computer system.

Thus, one aspect of the present invention pertains to a computer system or device, such as a computer or linked computers, operatively configured to implement the methods of the present invention.

Another aspect of the present invention pertains to computer code suitable for implementing the methods of the present invention on a suitable computer system.

In one embodiment, the present invention pertains to a computer program comprising computer program means adapted to perform a method according to the present invention when the program is run on a computer.

Another aspect of the present invention pertains to a data carrier which carries computer code suitable for implementing the methods of the present invention on a suitable computer.

In one embodiment, the present invention pertains to a computer program, as described above, embodied on a computer readable medium.

Examples of data carriers and computer readable media include chip media (e.g., ROM, RAM, flash memory (e.g. Memory Stick™, Compact Flash™, Smartmedia™), magnetic disk media (e.g., floppy disks, hard drives), optical disk media (e.g., compact disks (CDs), digital versatile disks (DVDs), magneto-optical disks), and magnetic tape media.

Processing of NMR Spectra

Following data acquisition and initial pre-processing, but preceding the application of subsequent analysis (e.g., pattern recognition), the data is subjected to additional pre-processing, including a step of "spectral replacement" as described herein.

NMR spectra are typically acquired, and subsequently, handled in digitised form. Conventional methods of spectral pre-processing of (digital) spectra are well known, and include, where applicable, signal averaging, Fourier transformation (and other transformation methods), phase correction, baseline correction, smoothing, and the like (see, for example, Lindon et al., 1980).

Modern spectroscopic methods often permit the collection of high or very high resolution spectra, In digital form, even a simple spectrum (e.g., signal intensity versus some function of energy or frequency) may have many thousands, if not tens of thousands of data points. It is often desirable to reduce or compress the data to give fewer data points, for both practical computing methods and also to effect some degree of signal averaging to compensate for physical effects, such as pH variation, compartmentalisation, and the like.

For example, a typical $^1$H NMR spectrum is recorded as signal intensity versus frequency. NMR signals from 1H nuclei have a characteristic position on this axis called a chemical shift. This is the frequency of observation relative to that of a reference signal. When this is divided by the observation frequency, this chemical shift is dimensionless, is given in parts per million (ppm) and is denoted by the symbol $\delta$. For brevity this axis will be termed the chemical shift axis. For $^1$H NMR spectra, this ranges from about $\delta$ 0 to $\delta$ 10. At a typical frequency resolution of about $10^{-4}$ to $10^{-3}$ ppm, the spectrum in digital form comprises about 10,000 to 100,000 data points (typically 2 to the power 16, or 64 k, or 65536).

As discussed above, it is often desirable to compress this data, for example, by a factor of about 10 to 100, to about 1000 descriptors.

For example, in one approach, the chemical shift axis, $\delta$, is "segmented" into "buckets" or "bins" of a specific length. For a 1-D $^1$H NMR spectrum which spans the range from $\delta$ 0 to $\delta$ 10, using a bucket length, $\Delta\delta$, of 0.04 yields 250 buckets, for example, $\delta$ 10.0–9.96, $\delta$ 9.96–9.92, $\delta$ 9.92–9.88, etc. The signal intensity within a given bucket may be averaged or integrated, and the resulting value reported. In this way, a spectrum with, for example, 100,000 original data points can be compressed to an equivalent representation with, for example, 250 data points.

A similar approach can be applied to 2-D spectra, 3-D spectra, and the like. For 2-D spectra, the "bucket" approach may be extended to a "patch." For 3-D spectra, the "bucket" approach may be extended to a "volume." For example, a 2-D $^1$H NMR spectrum which spans the range from $\delta$ 0 to $\delta$ 10 on both axes, using a patch of $\Delta\delta$ 0.1×$\Delta\delta$ 0.1 yields 10,000 patches. In this way, a spectrum with perhaps $10^8$ original data points can be compressed to an equivalent spectrum of $10^4$ data points.

Software for such processing of NMR spectra, for example AMIX (Analysis of MIXture, V 2.5, Bruker Analytik, Rheinstetten, Germany) is commercially available.

Often, certain spectral regions carry no real diagnostic information, or carry conflicting biochemical information, and it is often useful to remove these "redundant" regions before performing detailed analysis. In the simplest approach, the data points are deleted. In another simple approach, the data in the redundant regions are replaced with zero values.

For example, due to the dynamic range problem with water in comparison with other molecules, the water resonance (around $\delta$ 4.7) is suppressed. However, small variations in water suppression remain, and these variations can undesirably complicate analysis. Similarly, variations in water suppression may also affect the urea signal (around $\delta$ 5.5), by cross saturation. Therefore, it is often useful to delete the certain spectral regions, for example, from about $\delta$ 4.5 to 6.0 (e.g., $\delta$ 4.52 to 6.00).

Certain metabolites exhibit a strong degree of physiological variation (e.g., diurnal variation, dietary-related variation) that is unrelated to any pathophysiological process. Such variation may undesirably complicate analysis, and mask more relevant details. Therefore, it may be useful to delete the spectral regions associated with such compounds. However, it is often possible to isolate these effects in later (e.g., pattern recognition) analysis.

Xenobiotics (e.g., drugs) and their metabolites often give rise to large signals which do not directly correlate to the conditions (e.g., pathologies) which are induced by the xenobiotic. Therefore, it is often useful to delete the spectral regions associated with such compounds.

In general, NMR data is handled as a data matrix. Typically, each row in the matrix corresponds to an individual sample (often referred to as a "data vector"), and the entries in the columns are, for example, spectral intensity of a particular data point, at a particular $\delta$ or $\Delta\delta$ (often referred to as "descriptors").

It is often useful to pre-process data, for example, by addressing missing data, translation, scaling, and weighting.

If at all possible, missing data, for example, gaps in column values, should be avoided. However, if necessary, such missing data may replaced or "filled" with, for example, the mean value of a column ("mean fill"); a random value ("random fill"); or a value based on a principal component analysis ("principal component fill"). Each of these different approaches will have a different effect on subsequent PR analysis.

"Translation" of the descriptor coordinate axes can be useful. Examples of such translation include normalisation and mean centring.

"Normalisation" may be used to remove sample-to-sample variation. Many normalisation approaches are possible, and the can often be applied at any of several points in the analysis. Usually, normalisation is applied after redundant spectral regions have been removed. In one approach, each spectrum is normalised (scaled) by a factor of 1/A, where A is the sum of the absolute values of all of the descriptors for that spectrum. In this way, each data vector has the same length, specifically, 1. For example, if the sum of the absolute values of intensities for each bucket in a particular spectrum is 1067, then the intensity for each bucket for this particular spectrum is scaled by 1/1067.

"Mean centring" may be used to simplify interpretation. Usually, for each descriptor, the average value of that descriptor for all samples is subtracted. In this way, the mean of a descriptor coincides with the origin, and all descriptors are "centred" at zero. For example, if the average intensity at $\delta$ 10.0–9.96, for all spectra, is 1.2 units, then the intensity at $\delta$ 10.0–9.96, for all spectra, is reduced by 1.2 units.

In "unit variance (UV) scaling," data can be scaled to equal variance. Usually, the value of each descriptor is scaled by 1/StDev, where StDev is the standard deviation for that descriptor for all samples. For example, if the standard deviation at $\delta$ 10.0–9.96, for all spectra, is 2.5 units, then the intensity at $\delta$ 10.0–9.96, for all spectra, is scaled by 1/2.5 or 0.4. Unit variance scaling may be used to reduce the impact of "noisy" data. For example, some metabolites in biofluids show a strong degree of physiological variation (e.g., diurnal variation, dietary-related variation) that is unrelated to any pathophysiological process. Without unit variance scaling, these noisy metabolites may dominate subsequent analysis.

"Logarithmic scaling" may be used to assist interpretation when data have a positive skew and/or when data spans a large range, e.g., several orders of magnitude. Usually, for each descriptor, the value is replaced by the logarithm of that value. For example, the intensity at $\delta$ 10.0–9.96 is replaced the logarithm of the intensity at $\delta$ 10.0–9.96, for all spectra.

In "equal range scaling," each descriptor is divided by the range of that descriptor for all samples. In this way, all descriptors have the same range, that is, 1. For example, if, at $\delta$ 10.0–9.96, for all spectra, the largest value is 87 units and the smallest value is 1, then the range is 86 units, and the intensity at $\delta$ 10.0–9.96, for all spectra, is divided by 86 units. However, this method is sensitive to presence of outlier points.

In "autoscaling," each data vector is mean centred and unit variance scaled. This technique is a very useful because each descriptor is then weighted equally and, in the case of NMR descriptors, large and small peaks are treated with equal emphasis. This can be important for metabolites present at very low levels but still NMR-detectable.

Several supervised methods of scaling data are also known. Some of these can provide a measure of the ability of a parameter (e.g., a descriptor) to discriminate between classes, and can be used to improve classification by stretching a separation.

For example, in "variance weighting," the variance weight of a single parameter (e.g., a descriptor) is calculated as the ratio of the inter-class variances to the sum of the intra-class variances. A large value means that this variable is discriminating between the classes. For example, if the samples are known to fall into two classes (e.g., a training set), it is possible to examine the mean and variance of each descriptor. If a descriptor has very different mean values and a small variance, then it will be good at separating the classes.

"Feature weighting" is a more general description of variance weighting, where not only the mean and standard deviation of each descriptor is calculated, but other well known weighting factors, such as the Fisher weight, are used.

Spurious or irregular data ("outliers"), which are not representative, are preferably identified and removed. Common reasons for irregular data ("outliers") include poor phase correction, poor baseline correction, poor chemical shift referencing, poor water suppression, bacterial contamination, shifts in the pH of the biofluid, toxin- or disease-induced biochemical response, and idiosyncratic response to xenobiotics.

Outliers are identified in different ways depending on the method of analysis used. For example, when using principal component analysis (PCA), small numbers of samples lying far from the rest of the replicate group can be identified by eye as outliers. A more objective means of identification for PCA is to use the Hotelling's T Test which is the multivariate version of the well known Student's T test used in univariate statistics. For any given sample, the T2 value can be calculated and this is compared with a standard value within which a chosen fraction (e.g., 95%) of the samples would normally lie Samples with T2 values substantially outside this limit can then be flagged as outliers. Also, when using more sophisticated supervised methods, such as SIMCA or PNNs, a similar method is used. A confidence level (e.g., 95%) is selected and the region of multivariate space corresponding to confidence values above this limit is determined. This region can be displayed graphically in several different ways (for example by plotting the critical T2 ellipse on a PCA scores plot). Any samples falling outside the high confidence region are flagged as potential outliers. Naturally, such samples are investigated in detail to determine the causes of their outlying nature before removing them from the model.

Applications

As discussed above, the methods of the present Invention may be used in the analysis of chemical, biochemical, and biological data.

Metabonomic methods, in conjunction with the methods of the present invention, provide powerful means for the diagnosis, prognosis, and treatment of disease, for understanding the benefits and side-effects of xenobiotic compounds thereby aiding the drug development process, as well as for improving therapeutic regimes for current drugs.

For example, applications of metabonomic methods, in conjunction with the methods of the present invention, include, but are not limited to, early detection of abnormality/problem; differential diagnosis (classification of disease); prognosis (prediction of future outcome); therapeutic monitoring; identifying, classifying, determining the progress of, and monitoring the treatment of, infectious diseases; clinical evaluations of drug therapy and efficacy; detection of toxic side-effects of drugs and model compounds (e.g., in the drug development process and in clinical trials); investigation of idiosyncratic toxicity; characterization and identification of drugs used in overdose; classification, fingerprinting, and diagnosis of metabolic diseases (e.g., inborn errors of metabolism); improvement in the quality control of transgenic animal models of disease; aiding the design of transgenic models of disease; and searching for new biochemical markers of disease and/or tissue or organ damage.

Metabonomic methods, in conjunction with the methods of the present invention, may be used as an alternative or adjunct to the various genomic, pharmacogenomic, and proteomic methods, including those described above.

Metabonomic methods, in conjunction with the methods of the present invention, may also be used to identify (known or novel) genotypes and/or phenotypes, and to determine an organism's phenotype or genotype. This may assist with the choice of a suitable treatment or allow assessment of its relevance in a drug development process. For example, the generation of metabonomic data in panels of individuals with disease states, infected states, or undergoing treatment may indicate response profiles of groups of individuals which can be differentiated into two or more subgroups, indicating that an allelic genetic basis for response to the disease, state, or treatment exists. For example a particular phenotype may not be susceptible to treatment with a certain drug, while another phenotype may be susceptible to treatment. Conversely, one phenotype might show toxicity because of a failure to metabolise and hence excrete a drug, which drug might be safe in another phenotype as it does not exhibit this effect. For example, metabonomic methods may be used to determine the acetylator status of an organism: there are two phenotypes, corresponding to "fast" and "slow" acetylation of drug metabolites. Phenotyping may be achieved on the basis of the urine alone (i.e., without dosing a xenobiotic), or on the basis of urine following dosing with a xenobiotic which has the potential for acetylation (e.g., galactosamine). Similar methods may also be used to determine other differences, such as other enzymatic polymorphisms, for example, cytochrome P450 polymorphism.

Metabonomic methods, in conjunction with the methods of the present invention, may also be used in studies of the biochemical consequences of genetic modification, for example, in "knock-out animals" where one or more genes have been removed or made non-functional; in "knock-in" animals where one or more genes have been incorporated from the same or a different species; and in animals where the number of copies of a gene has been increased, as in the model which results in the over-expression of the beta amyloid protein in mice brains as a model for Alzheimer's disease). Genes can be transferred between bacterial, plant and animal species.

The combination of genomic, proteomic, and metabonomic data sets into comprehensive "bionomic" systems may permit an holistic evaluation of perturbed in vivo function.

The methods of the present invention are also useful in other applications, including investigations into the effects of environmental pollutants (e.g., wastewater analysis, animal population studies, studies of invertebrates, marine organisms), and the effects of xenobiotic stimuli and genetic changes in plants.

EXAMPLES

The following examples are provided solely to illustrate the present invention and are not intended to limit the scope of the invention, as described herein.

The methods of the present invention have been exemplified in their application to NMR spectra. Nonetheless, the methods of the present invention are similarly applicable to other types of spectra, such as those discussed above.

A spectral data set consisting of 75 spectra was simulated, representing spectra taken at five time points ($T_1$, $T_2$, $T_3$, $T_4$, and $T_5$) for three groups of five animals ($A_1$–$A_5$, $A_6$–$A_{10}$, and $A_{11}$–$A_{16}$). The first group of animals ($A_1$–$A_5$) were control animals. The second group of animals ($A_6$–$A_{10}$) were dosed animals. The third group of animals ($A_{11}$–$A_{15}$) were also dosed animals, but differently so (for example, with a different drug/toxin, or a different amount of the same drug/toxin).

Figure 1:
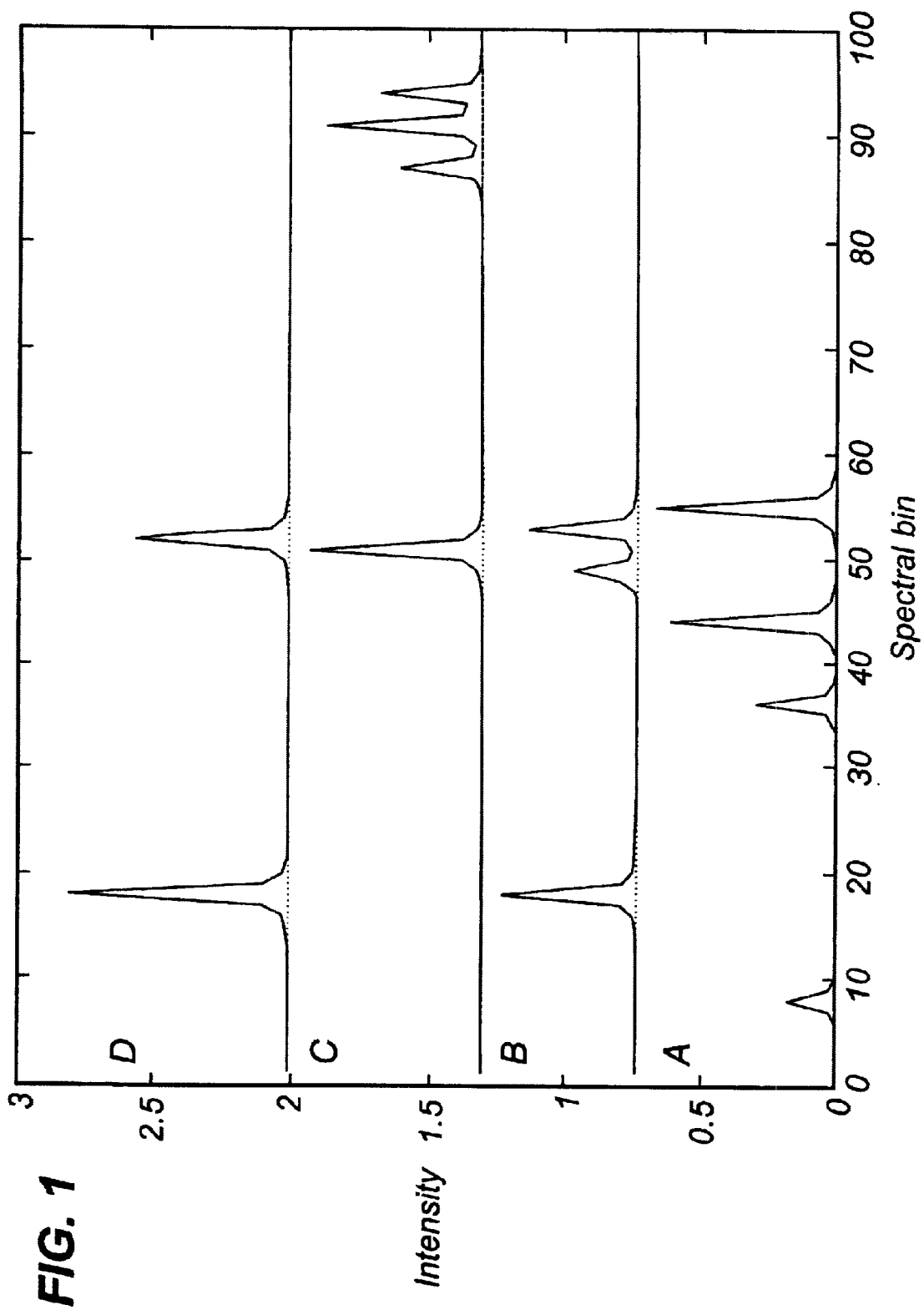
FIG. 1 is a graph showing the four base spectra, denoted A, B, C, and D, which were used to generate the simulated data in the Examples.

The data set was generated using a PARAFAC model (See, for example, Bro, 1997). In this model, the generated spectra were linear combinations of the four base spectra (denoted A, B, C, and D) shown in FIG. 1, where chemical shift (represented by spectral bin number) is along the x-axis, and spectral intensity is along the y-axis. The contribution of each base spectrum is determined by two corresponding factors, the animal factor and the time factor, discussed below.

Figure 2:
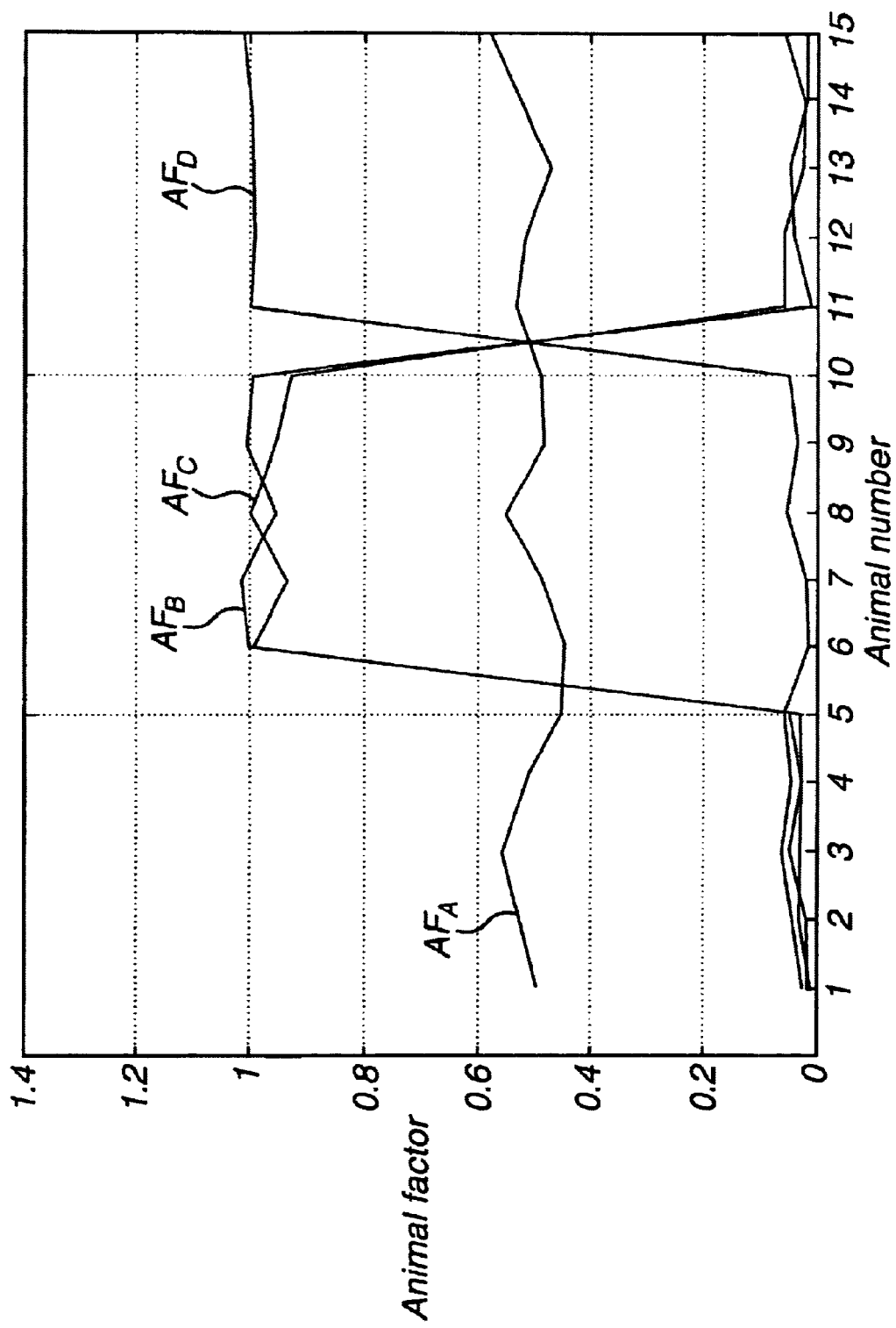
FIG. 2 is a graph showing the four animal factors, denoted $AF_A$, $AF_B$, $AF_C$, and $AF_D$, which were used to generate the simulated data in the Examples.

The animal factors (denoted $AF_A$, $AF_B$, $AF_C$, and $AF_D$) are shown in FIG. 2, where the animal number ($A_1$–$A_{15}$) is along the x-axis, and the animal factor is along the y-axis. Thus, for each base spectrum and animal, there is an animal factor, e.g., $AF_{B-A7}$ for base spectrum B and animal 7.

Figure 3:
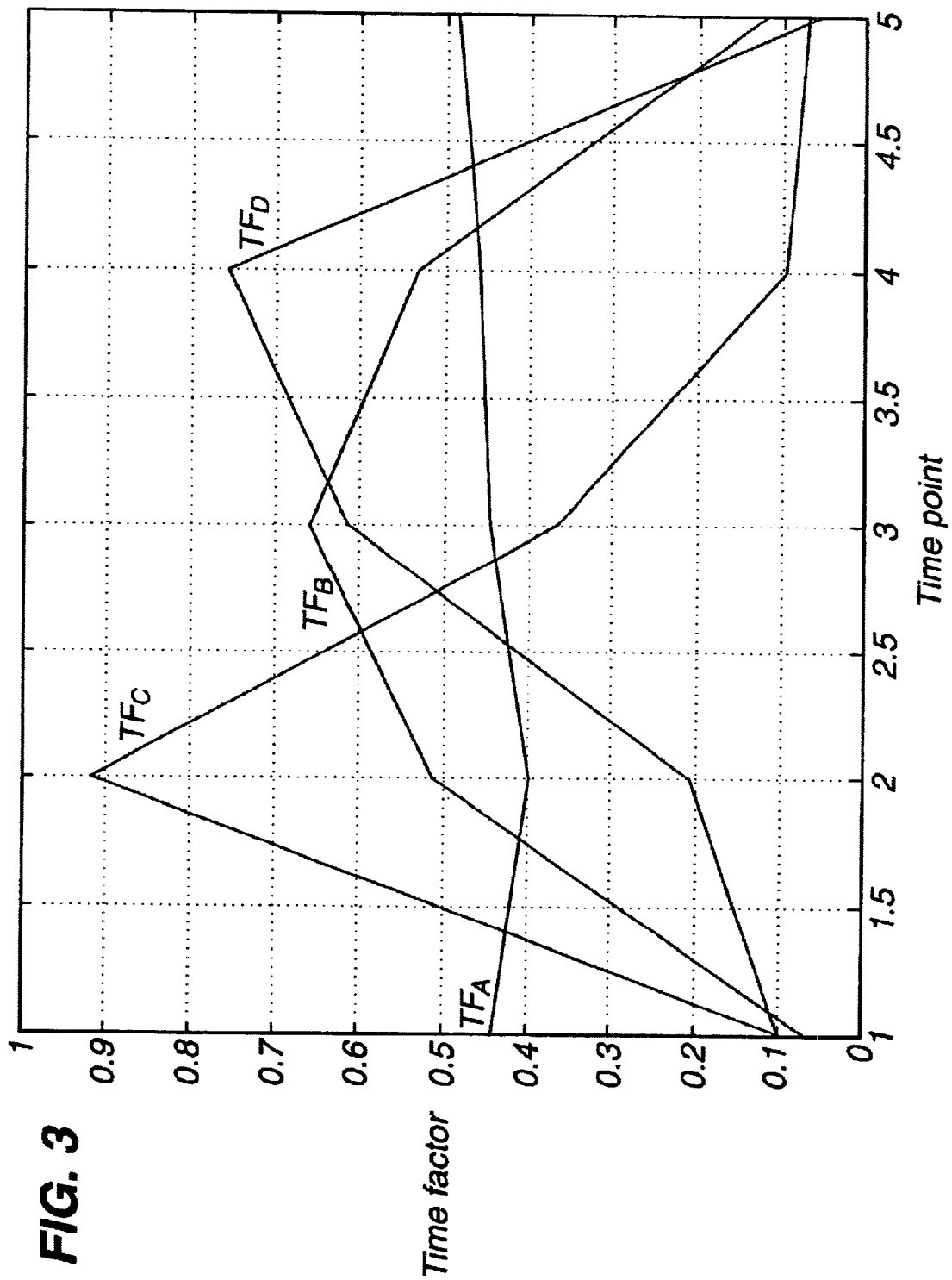
FIG. 3 is a graph showing the four time factors, denoted $TF_A$, $TF_B$, $TF_C$, and $TF_D$, which were used to generate the simulated data in the Examples.

The time factors (denoted $TF_A$, $TF_B$, $TF_C$, and $TF_D$) are shown in FIG. 3, where the time point ($T_1$–$T_5$) is along the x-axis and the time factor is along the y-axis. Thus, for each base spectrum and time point, there is a time factor, e.g., $TF_B$–$T_3$ for base spectrum B and time point 3.

For example, the spectrum for animal number 7 ($A_7$) at time point 3 ($T_3$) is a linear combination of the four base spectra (A, B, C, D), with coefficients ($AF_{A-A7}*TF_{A-T3}$), ($AF_{B-A7}*TF_{B-T3}$), ($AF_{C-A7}*TF_{C-T3}$) and ($AF_{D-A7}*TF_{D-T3}$), respectively.

Figure 4:
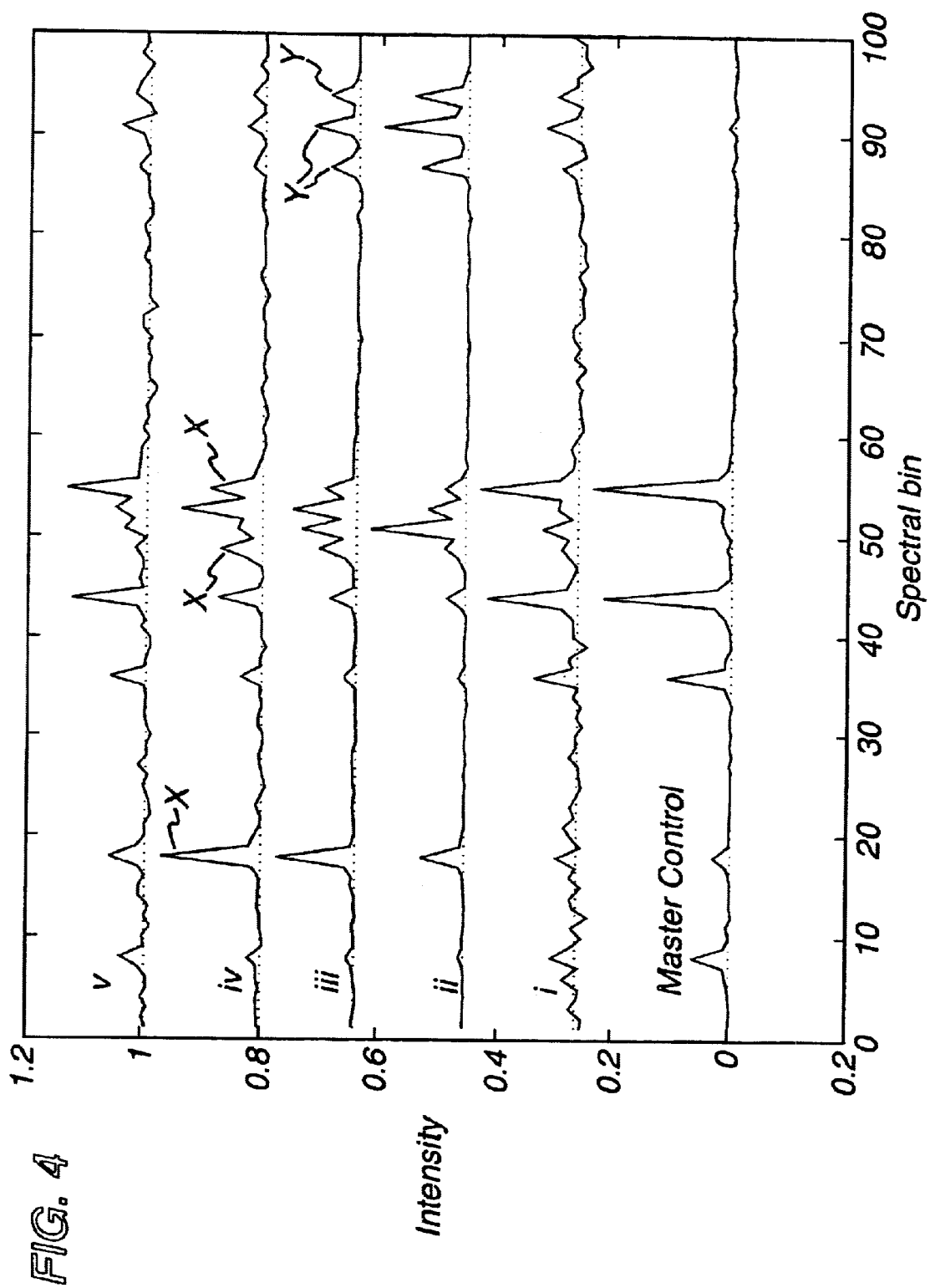
FIG. 4 is a graph showing spectra for animal number 6 ($A_6$) at the five time points ($T_1$–$T_5$), denoted (i), (ii), (iii), (iv), and (v), respectively, as well as the master control spectrum.

For example, spectra for animal number 6 (A6) at the five time points ($T_1$–$T_5$) are shown in FIG. 4, as curves (i), (ii), (iii), (iv), and (v), respectively. Spectrum (i) is for $A_6$–$T_1$; spectrum (ii) is for $A_6$–$T_2$; spectrum (iii) is for $A_6$–$T_3$; spectrum (iv) is for $A_6$–$T_4$; and spectrum (v) is for $A_6$–$T_5$. Those peaks marked (X) will be the subject of spectral replacement (see below). The peaks marked (Y) are the endogenous metabolites associated with the animals' response to the applied stimulus.

For the control animals ($A_1$–$A_5$), the animal factors $AF_B$, $AF_C$, and $AF_D$ are all very small (less than about 0.05) while the animal factor $AF_A$ is large and approximately constant (about 0.5). Therefore, the spectra for the control animals is dominated by base spectrum A. Also, the time factor for base spectrum A, $TF_A$, is approximately constant for all time points (about 0.45). Therefore, qualitatively (and as expected in a real control group), all spectra for the control animals are very similar. The master control spectrum, in this case, the mean of all 25 control spectra (5 animals, time points), is shown in FIG. 4.

For the second group of animals ($A_6$–$A_{10}$), the animal factor $AF_D$ is very small (less than about 0,05) while the animal factor $AF_A$ is about 0.5, and the animal factors $AF_B$ and $AF_C$ are about 1.0. Therefore, the spectra for the second group of animals is dominated by the base spectra A, B and C. Also, the time factor for base spectrum A, $TF_A$, is approximately constant for all time points (about 0.45), while the time factor for the base spectrum B, $TF_B$, varies from about 0.1 to about 0.65, and peaks at time point 3, and the time factor for the base spectrum C, $TF_C$, varies from about 0.1 to about 0.55, and peaks at time point 4. Therefore, qualitatively, the spectra for the second group of animals will resemble the base spectrum A, but with varying amounts of base spectra B and C superposed thereupon.

For the third group of animals ($A_{11}$–$A_{15}$), the animal factors $AF_B$ and $AF_C$ are very small (less than about 0.05) while the animal factor $AF_A$ is about 0.5, and the animal factor $AF_D$ is about 1.0. Therefore, the spectra for the third group of animals is dominated by the base spectra A and D. Also, the time factor for base spectrum A, $TF_A$, is approximately constant for all time points (about 0.45), while the time factor for the base spectrum D, $TF_D$, varies from about 0.1 to about 0.75, and peaks at time point 4. Therefore, qualitatively, the spectra for the third group of animals will resemble the base spectrum A, but with varying amounts of base spectrum D superposed thereupon.

As discussed above, base spectrum A qualitatively represents the spectrum for control animals (although it is also present in the spectra for dosed animals). For the purposes of this example, base spectrum B qualitatively represents a metabolite or metabolites of the administered drug/toxin (i.e., an interfering signal), while base spectra C and D qualitatively represent different biomarkers or biomarker combinations of the animals' response to the two different drug/toxin regimes.

Using a conventional analysis, the spectral regions associated with the interfering signal (i.e., in base spectrum B) were identified as target regions (in this example, spectral bin numbers 15–26 inclusive and 47–58 inclusive), and the data in these spectral regions deleted from all spectra. The resulting "deleted" spectra were re-normalised and then analysed by principal component analysis.

The resulting scores plot (PC2 versus PC1) is shown in FIG. 7. Two groups of data points were clearly separated (from the control population), specifically $A_6$–$A_{10}$, $T_2$ and $A_6$–$A_{10}$,$T_3$. Two groups of data points were partially separated, specifically $A_6$–$A_{10}$, $T_1$ and $A_6$–$A_{10}$, $T_4$. Several groups of data points were not separated, specifically $A_6$–$A_{10}$, $T_5$ and $A_{11}$–$A_{15}$, $T_{1-5}$.

Using the methods of the present invention, the target regions, that is, the spectral regions associated with the interfering signal (i.e., in base spectrum B) were identified (in this example, spectral bin numbers 15–26 inclusive and 47–58 inclusive). A master control spectrum was calculated as the mean of the 25 control animal spectra (the master control spectrum is shown in FIG. 4). The target regions in all spectra for animals 6–10 were then replaced with corresponding scaled replacement regions from the master control spectrum. The resulting target-replaced spectra were then renormalized to give normalised target-replace spectra.

Figure 5:
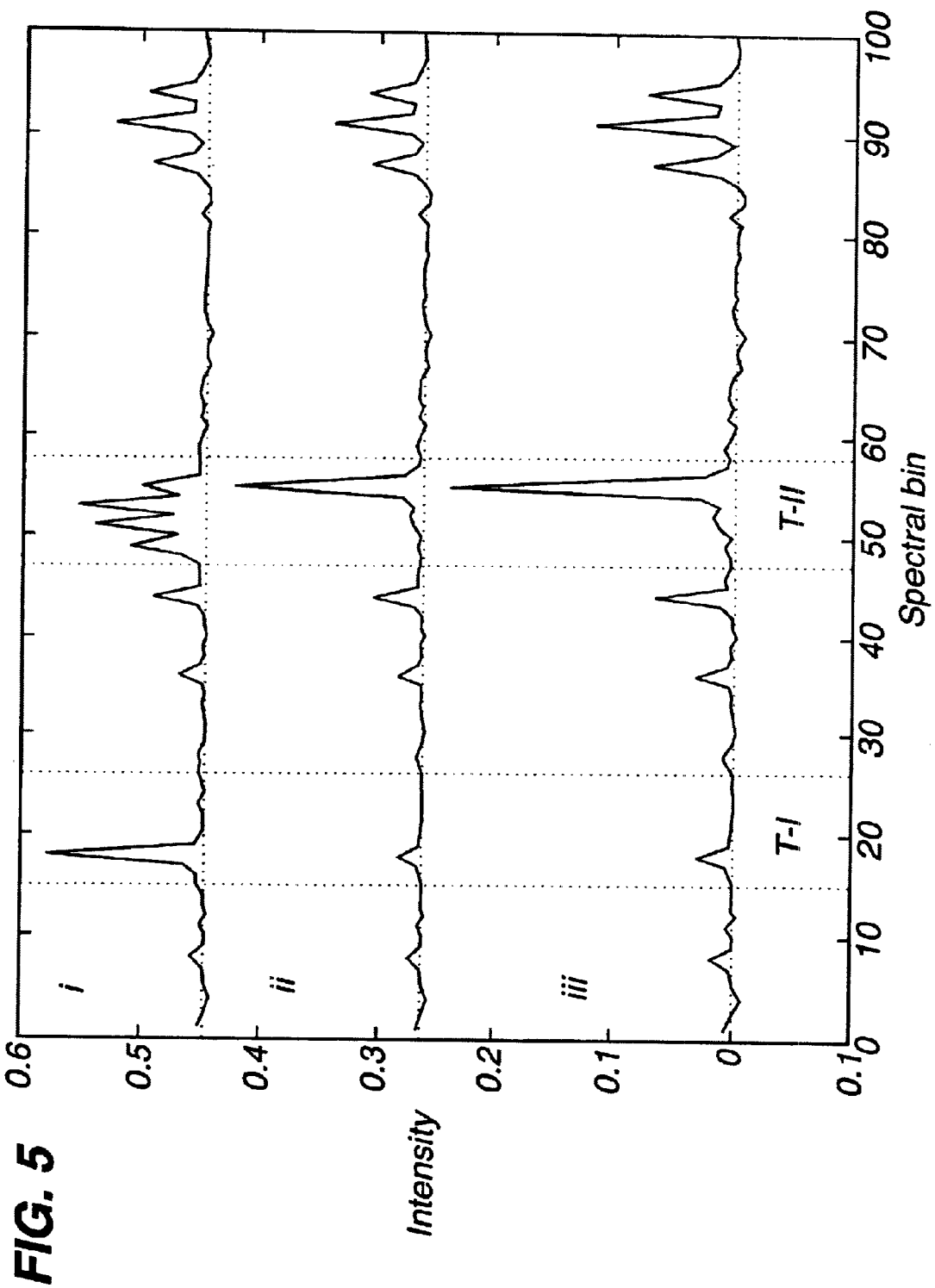
FIG. 5 is a graph showing, for animal number 6 at time point 2 ($A_6$, $T_2$), (i) the original spectrum, before replacement; (ii) the spectrum after spectral replacement; and (iii) spectrum (ii) after re-normalisation.
Figure 6:
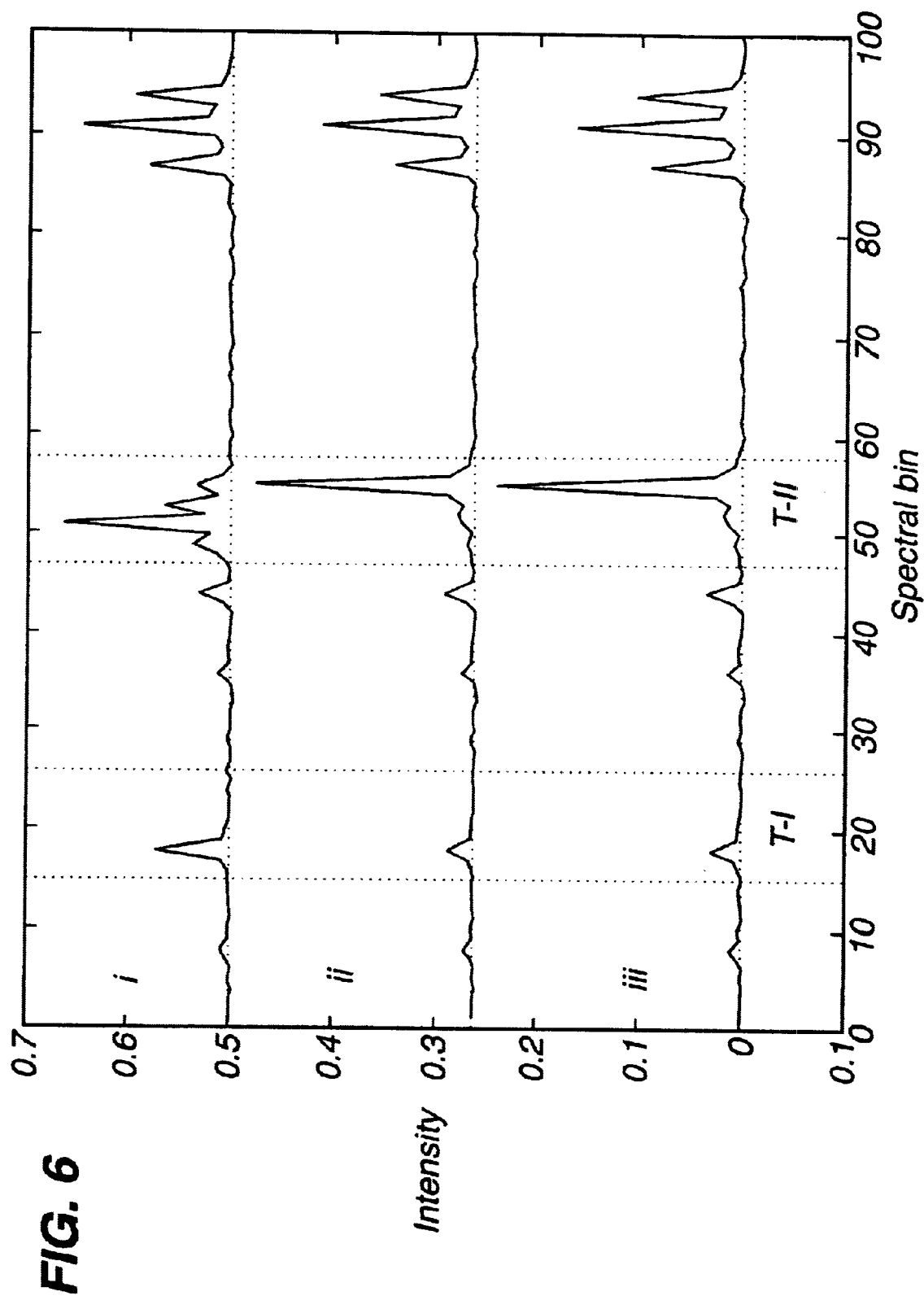
FIG. 6 is a graph showing, for animal number 6 at time point 3 ($A_6$, $T_3$), (i) the original spectrum, before replacement; (ii) the spectrum after spectral replacement.

Two examples of this process are shown in FIG. 5 (for the spectrum for animal number 6 at time point 2, $A_6$, $T_2$) and FIG. 6 (for the spectrum for animal number 6 at time point 3,$A_6$, $T_3$). In each case: spectrum (i) is the original spectrum, before replacement; spectrum (ii) is the spectrum after spectral replacement; spectrum (iii) is spectrum (ii) after re-normalisation; the first target region (T-I) was spectral bin numbers 15–26 inclusive, and the second target region (T-II) was spectral bin numbers 47–58 inclusive, as indicated by the vertical dotted lines. The numerical parameters are summarised in the table below.

TABLE 1

Parameters for Spectral Replacement

| | i = $A_6T_2$ | i = $A_6T_3$ |
|---|---|---|
| $I_{Yi}$ | 3.75 | 2.56 |
| $\Sigma I_{Yi,Tk}$ | 1.77 | 1.55 |
| $I_{CM}$ | 0.55 | 0.55 |
| $\Sigma I_{CM,R}$ | 0.24 | 0.24 |
| $f_i$ | 6.33 | 3.23 |
| $N_f$ | 1.82 | 1.82 |

The resulting normalised target-replaced spectra were then analysed by principal component analysis. In one analysis, the replaced regions were treated as "missing data" (a conventional method in PCA analysis) and the resulting scores plot (PC2 versus PC1) is shown in FIG. 8. Nine groups of data points were clearly separated (from the control population), specifically $A_6$–$A_{10}$, $T_{1-5}$ and $A_{11}$–$A_{15}$, $T_{1-4}$. One group of data points was not separated, specifically $A_{11}$–$A_{15}$, $T_5$.

In another analysis, the replaced regions were not treated as "missing data" and the resulting scores plot (PC2 versus PC1) is shown in FIG. 9. Eight groups of data points were clearly separated (from the control population), specifically $A_6$–$A_{10}$, $T_{1-4}$ and $A_{11}$–$A_{15}$, $T_{1-4}$. One group of data points was partially separated, specifically $A_6$–$A_{10}$, $T_5$. One group of data points was not separated, specifically $A_{11}$–$A_{15}$, $T_5$.

The clear separation of the $A_{11}$–$A_{16}$ data in FIGS. 8 and 9 (specifically, $A_{11}$–$A_{15}$, $T_{1-4}$), as compared to the lack of their separation in FIG. 7, demonstrates the effectiveness of the methods of the present invention, specifically, in retrieving information that would otherwise have been lost or missed.

REFERENCES

A number of patents and publications are cited above in order to more fully describe and disclose the invention and the state of the art to which the invention pertains. Full citations for these references are provided below. Each of these references is incorporated herein by reference in its entirety into the present disclosure, to the same extent as if each individual reference was specifically and individually indicated to be incorporated by reference.

Anker, L. S., and Jurs, P. C., 1992, "Prediction of C-13 nuclear magnetic resonance chemical shifts by artificial neural networks," *Anal. Chem.*, Vol. 64, p. 1157.

Anthony, M. L. et al., 1994, "Pattern recognition classification of the site of nephrotoxicity based on metabolic data derived from proton nuclear magnetic resonance spectra of urine," *Mol. Pharmacol.*, Vol. 46, pp. 199–211.

Anthony, M. L. et al., 1995, "Classification of toxin-induced changes in $^1H$ NMR spectra of urine using an artificial neural network," *J. Pharm. Biomed. Anal.*, Vol. 13, pp. 205–211.

Beckwith-Hall, B. M. et al., 1998, "Nuclear magnetic spectroscopic and principal components analysis investigations into biochemical effects of three model hepatotoxins," *Chem. Res. Tox.*, Vol. 11, pp. 260–272.

Bishop, C., 1995, *Neural Networks for Pattern Recognition*, University Press, Oxford, England, pp. 164–193.

Bretthorst, 1990, "An Introduction to Parameter Estimation Using Bayesian Probability Thoery," in: *Maximum Entropy and Bayesian Methods*, (Fougere, P. F., editor) (Kluwer Academic Publishers, The Netherlands), pp. 53–79.

Bro, R., 1997, "PARAFAC. Tutorial and applications," in *Chemometrics and Intelligent Laboratory Systems*, Vol. 38, pp. 149–171.

Broomhead, D. S., and Lowe, D., 1988, "Multi-variable functional interpolation and adaptive networks," *Complex Systems*, Vol. 2, p. 321.

Brown, T. R. and Stoyanova, R., 1996, "NMR spectral quantitation by principal component analysis. 2. Determination of frequency and phase shifts," *J. Magn. Reson.*, Vol. 112B, p. 32.

Fan, T. W. -M., 1996, "Metabolite profiling by one- and two-dimensional NMR analysis of complex mixtures," *Prog. NMR Spectrosc.*, Vol. 28, pp. 161–219.

Farrant, R. D., et al., 1992, "An automatic data reduction and transfer method to aid pattern recognition analysis and classification of NMR spectra," *J. Pharm. Biomed. Anal.*, Vol. 10, p. 141.

Frank, I. E., et al., 1984, "Prediction of product quality from spectral data using the partial least squares method," *J. Chem. Info. Comp.*, Vol. 24, p. 20.

Gartland, K. P. R. et al., 1990a, "A pattern recognition approach to the comparison of $^1H$ NMR and clinical chemical data for classification of nephrotoxicity," *J. Pharm. Biomed. Anal.*, Vol. 8, pp. 963–968.

Gartland, K. P. R. et al., 1990b, "Pattern recognition analysis of high resolution $^1H$ NMR spectra of urine. A nonlinear mapping approach to the classification of toxicological data," *NMR in Biomed.*, Vol. 3, pp. 166–172.

Gartland, K. P. R. et al., 1991, "The application of pattern recognition methods to the analysis and classification of toxicological data derived from proton NMR spectroscopy of urine," *Mol. Pharmacol.*, Vol. 39, pp. 629–642.

Geisow, M. J., 1998, "Proteomics: One small step for a digital computer, one giant leap for humankind," *Nature Biotechnology*, Vol. 16, p. 206.

Gygi, S. P., et al., 1999, "Correlation between protein and mRNA abundance in yeast," *Molecular and Cellular Biology*, Vol. 19, pp. 1720–1730.

Hare, B. J., and Prestegard, J. H., 1994, "Application of networks to automated assignment of NMR spectra of proteins," *J. Biomol. NMR*, Vol. 4, p. 35.

Holmes, E. et al., 1998a, "Development of a model for classification of toxin-induced lesions using $^1H$ NMR spectroscopy of urine combined with pattern recognition," *NMR in Biomed.*, Vol. 11, pp. 235–244.

Holmes, E. et al., 1998b, "The identification of novel biomarkers of renal toxicity using automatic data reduction techniques and PCA of proton NMR spectra of urine," *Chemomet. & Intel. Lab Systems*, Vol. 44, pp. 245–255.

Holmes, E., et al., 1992, "NMR spectroscopy and pattern recognition analysis of the biochemical processes associated with the progression and recovery from nephrotoxic lesions in the rat induced by mercury(II)chloride and 2-bromo-ethanamine," *Mol. Pharmacol.*, Vol. 42, pp. 922–930.

Holmes, E., et al., 1994, "Automatic data reduction and pattern recognition methods for analysis of $^1H$ NMR spectra of human urine from normal and pathological states," *Anal. Biochem.*, Vol. 220, pp. 284–296.

Joreskog, K. G., and Wold, H., 1982 *Systems under Indirect Observation*, North Holland, Amsterdam.

Kienk, H. P., et al., 1997, "The complete genome sequence of the hyperthermophilic, sulphate-reducing archaeon *Archaeoglobus fulgidus,*" *Nature*, Vol. 390, pp. 364–370.

Lindon, J. C., et al., 1999, "NMR spectroscopy of biofluids," in *Annual Reports on NMR Spectroscopy* (Webb, G. A., ed.), Academic Press (London), Vol. 38, pp. 1–88.

Lindon, J. C., Ferrige A. G., 1980, "Digitisation and Data Processing in Fourier Transform NMR," *Progress in NMR Spectroscopy*, Vol. 14, pp. 27–66.

Moka, D., et al., 1998, "Biochemical classification of kidney carcinoma biopsy samples using magic angle spinning NMR spectroscopy," *J. Pharm. Biomed. Anal.*, Vol. 17, pp. 125–132.

Nicholson, J. K. et al., 1989, "High resolution proton magnetic resonance spectroscopy of biological fluids," *Prog. NMR Spectrosc.*, Vol. 21, pp.449–501.

Nicholson, J. K. et al., 1995, "750 MHz $^1$H and $^1$H-$^{13}$C NMR spectroscopy of human blood plasma,"*Anal. Chem.* Vol. 67, pp.793–811.

Nicholson, J. K. et al., 1999, "Metabonomics— understanding the metabolic response of living systems to pathophysiological stimuli via multivariate statistical analysis of biological NMR spectroscopic data," *Xenobiotica*, Vol. 29, pp. 1181–1189.

Nillson, N. J., 1965, *Learning Machines*, McGraw-Hill, N.Y.

Parzen, E., 1962, "On estimation of a probability density function and mode," *Ann. Mathemat. Stat.*, Vol. 33, p. 1065.

Patterson, D., 1996, *Artificial Neural Networks*, Prentice Hall, Singapore.

Press, William H., Teukolsky, Saul A., Vetterling, William T., Flannery, Brian P., January 1993, *Numerical Recipes in C: The Art of Scientific Computing,* 2nd edition, Cambridge University Press.

Quinlan, J. R., 1986, "Induction of decision trees," *Machine Learning*, Vol. 1, p. 81.

Sharaf, M. A., et al., 1986, *Chemometrics*, J. Wiley & Sons, New York.

Speckt, D. F., 1990, "Probabilistic neural networks," *Neur. Networks*, Vol. 3, p. 109.

Spraul, M. et al., 1994, "Automatic reduction of NMR spectroscopic data for statistical and pattern recognition classification of samples," *J. Pharm. Biomed, Anal.*, Vol. 12, pp. 1215–1225.

Sze, D. Y., et al., 1994, "High-resolution proton NMR studies of lymphocyte extracts," *Immunomethods*, Vol. 4, pp. 113–126.

Tomlins, A. M. et al., 1998, "High resolution magic angle spinning $^1$H NMR analysis of intact prostatic hyperplastic and tumour tissues," *Anal. Comm.*, Vol. 35, pp. 113–115.

Tranter, G. E., et al., 1999, "Metabonomic prediction of drug toxicity via probabilistic neural network analysis of NMR biofluid data," *Abstr. 9$^{th}$ North American ISSX Meeting*, Oct. 24–28,1999, p. 246.

Wasserman, P. D., 1989, *Neural Computing: Theory and Practice*, (Van Nostrand, ed.) Reinhold, N.Y., USA.

Wold, H., 1966, in *Multivariate Analysis* (P. R. Krishnaiah, Ed.) Academic Press, New York.

Wold, S., 1976, "Pattern recognition by means of disjoint principal components models," *Pattern Recog.*, Vol. 8, p. 127.

What is claimed is:

1. A method for processing a sample spectrum comprising:

replacing each of one or more target regions in said sample spectrum with a corresponding replacement region of a master control spectrum to give a target-replaced sample spectrum, wherein said replacement region has been scaled so as tQ have the same fraction of the total integrated intensity in said target-replaced sample spectrum as it did in said master control spectrum.

2. A sample spectrum which has been processed by a method according to claim 1.

3. A method for processing a plurality of sample spectra, comprising processing each of said sample spectra by a method according to claim 1.

4. A method of analysis of an applied stimulus, comprising the steps of:

(a) providing one or more sample spectra for each of one or more samples from each of one or more organisms which have been subjected to said applied stimulus;

(b) providing a master control spectrum derived from one or more control spectra for each of one or more samples from each of one or more organisms which have not been subjected to said applied stimulus;

(c) processing each of said sample spectra using a method according to claim 1.

5. A method according to claim 4, wherein said applied stimulus is a xenobiotic.

6. A method according to claim 4, wherein said applied stimulus is a disease state.

7. A method according to claim 4, wherein said applied stimulus is a genetic modification.

8. A method for identifying a biomarker or biomarker combination for an applied stimulus, comprising a method of analysis according to claim 4.

9. A biomarker or biomarker combination identified by a method according to claim 8.

10. A method of diagnosis of an applied stimulus employing a biomarker identified by a method according to claim 8.

11. An assay which employs a biomarker identified by a method according to claim 8.

12. A method of classifying an applied stimulus, comprising using the method of claim 4 to classify said stimulus.

13. A method of diagnosis of an applied stimulus, comprising using the method of claim 4 to provide a diagnosis of said stimulus.

14. A method of therapeutic monitoring of a subject undergoing therapy, comprising using the method of claim 4 for therapeutic monitoring of said subject.

15. A method of evaluating drug therapy and/or drug efficacy, comprising using the method of claim 4 to evaluate said drug therapy and/or drug efficacy.

16. A method of detecting toxic side-effects of drug, comprising using the method of claim 4 detect toxic side-effects of said drug.

17. A method of characterising and/or identifying a drug in overdose, comprising using the method of claim 4 to characterise and/or identify said drug.

18. A method according to claim 4, wherein said spectrum or spectra is an NMR spectrum or NMR spectra.

19. A computer system operatively configured to implement a method according to claim 1.

20. Computer code suitable for implementing a method according to claim 1 on a suitable computer system.

21. A data carrier which carries computer code suitable for implementing a method according to claim 1 on a suitable computer system.

22. A method for processing a sample spectrum for a test sample, said method comprising the steps of:

(a) identifying, in said sample spectrum, one or more target regions for replacement;

(b) providing a master control spectrum which comprises one replacement region corresponding to each of said target regions; and, (c) replacing each of said target regions with the corresponding replacement region to give a target-replaced sample spectrum, wherein said replacement region has been scaled so as to have the same fraction of the total integrated intensity in said target-replaced sample spectrum as it did in said master control spectrum.

23. A method according to claim 22, further comprising the subsequent step of:

(d) normalising said target-replaced sample spectrum to give a normalised target-replaced sample spectrum.

24. A method according to claim 23, wherein, in said replacing step (c), each of said target regions is replaced with the corresponding replacement region to give a target-replaced sample spectrum, wherein said replacement region has been scaled by a factor, f, given by the formula:

$$f = \frac{I_Y - \sum_k I_{Y,Tk}}{I_{CM} - \sum_k I_{CM,Rk}}$$

wherein:

$I_Y$ is the total integrated intensity of the sample spectrum;

$I_{Y,Tk}$ is the integrated intensity of the target region;

$I_{CM}$ is the total integrated intensity of the master control spectrum;

$I_{CM,Rk}$ is the integrated intensity of the replacement region;

k ranges from 1 to $n_t$; and, $n_t$ is number of target regions.

25. A method according to claim 22, wherein, in said replacing step (c), each of said target regions is replaced with the corresponding replacement region to give a target-replaced sample spectrum, wherein said replacement region has been scaled by a factor, f, given by the formula:

$$f = \frac{I_Y - \sum_k I_{Y,Tk}}{I_{CM} - \sum_k I_{CM,Rk}}$$

wherein:

$I_Y$ is the total integrated intensity of the sample spectrum;

$I_{Y,Tk}$ is the integrated intensity of the target region;

$I_{CM}$ is the total integrated intensity of the master control spectrum;

$I_{CM,Rk}$ is the integrated intensity of the replacement region;

k ranges from 1 to $n_t$; and, $n_t$ is number of target regions.

26. A sample spectrum which has been processed by a method according to claim 22.

27. A method for processing a plurality of sample spectra, comprising processing each of said sample spectra by a method according to claim 22.

28. A method of analysis of an applied stimulus, comprising the steps of:

(a) providing one or more sample spectra for each of one or more samples from each of one or more organisms which have been subjected to said applied stimulus;

(b) providing a master control spectrum derived from one or more control spectra for each of one or more samples from each of one or more organisms which have not been subjected to said applied stimulus;

(c) processing each of said sample spectra using a method according to claim 22.

29. A method for processing a sample NMR spectrum for a test sample, said method comprising the steps of:

(a) identifying, in said sample NMR spectrum, one or more target regions for replacement, wherein each of said target regions is defined by a chemical shift range;

(b) providing a master control NMR spectrum which comprises one replacement region corresponding to each of said target regions, wherein a target region and its corresponding replacement region are defined by the same chemical shift range; and, (c) replacing each of said target regions with the corresponding replacement region to give a target-replaced sample NMR spectrum, wherein said replacement region has been scaled so as to have the same fraction of the total integrated intensity in said target-replaced sample NMR spectrum as it did in said master control NMR spectrum.

30. A method according to claim 29, further comprising the subsequent step of:

(d) normalising said target-replaced sample NMR spectrum to give a normalised target-replaced sample NMR spectrum.

31. A method according to claim 30, wherein, in said replacing step (c), each of said target regions is replaced with the corresponding replacement region to give a target-replaced sample spectrum, wherein said replacement region has been scaled by a factor, f, given by the formula:

$$f = \frac{I_Y - \sum_k I_{Y,Tk}}{I_{CM} - \sum_k I_{CM,Rk}}$$

wherein:

$I_Y$ is the total integrated intensity of the sample spectrum;

$I_{Y,Tk}$ is the integrated intensity of the target region;

$I_{CM}$ is the total integrated intensity of the master control spectrum;

$I_{CM,Rk}$ is the integrated intensity of the replacement region;

k ranges from 1 to $n_t$; and, $n_t$ is number of target regions.

32. A method according to claim 29, wherein, in said replacing step (c), each of said target regions is replaced with the corresponding replacement region to give a target-replaced sample spectrum, wherein said replacement region has been scaled by a factor, f, given by the formula:

$$f = \frac{I_Y - \sum_k I_{Y,Tk}}{I_{CM} - \sum_k I_{CM,Rk}}$$

wherein:

$I_Y$ is the total integrated intensity of the sample spectrum;

$I_{Y,Tk}$ is the integrated intensity of the target region;

$I_{CM}$ is the total integrated intensity of the master control spectrum;

$I_{CM,Rk}$ is the integrated intensity of the replacement region;

k ranges from 1 to $n_t$; and, $n_t$ is number of target regions.

33. A sample spectrum which has been processed by a method according to claim 29.

34. A method for processing a plurality of sample spectra, comprising processing each of said sample spectra by a method according to claim 29.

35. A method of analysis of an applied stimulus, comprising the steps of:

(a) providing one or more sample spectra for each of one or more samples from each of one or more organisms which have been subjected to said applied stimulus;

(b) providing a master control spectrum derived from one or more control spectra for each of one or more samples from each of one or more organisms which have not been subjected to said applied stimulus;

(c) processing each of said sample spectra using a method according to claim 29.

\* \* \* \* \*